US012107056B2

(12) United States Patent
Chan et al.

(10) Patent No.: US 12,107,056 B2
(45) Date of Patent: Oct. 1, 2024

(54) SEMICONDUCTOR DEVICE PACKAGE AND THE METHOD OF MANUFACTURING THE SAME

(71) Applicant: Advanced Semiconductor Engineering, Inc., Kaohsiung (TW)

(72) Inventors: Ya Fang Chan, Kaohsiung (TW); Yuan-Feng Chiang, Kaohsiung (TW); Po-Wei Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 157 days.

(21) Appl. No.: 16/745,331

(22) Filed: Jan. 16, 2020

(65) Prior Publication Data
US 2021/0225783 A1     Jul. 22, 2021

(51) Int. Cl.
| | |
|---|---|
| *H01L 23/66* | (2006.01) |
| *H01L 21/56* | (2006.01) |
| *H01L 21/768* | (2006.01) |
| *H01L 23/31* | (2006.01) |
| *H01L 23/495* | (2006.01) |

(52) U.S. Cl.
CPC ............ *H01L 23/66* (2013.01); *H01L 21/56* (2013.01); *H01L 21/76804* (2013.01); *H01L 23/3121* (2013.01); *H01L 23/49506* (2013.01); *H01L 2223/6644* (2013.01); *H01L 2223/6677* (2013.01)

(58) Field of Classification Search
CPC .......... H01L 23/5389; H01L 23/49506; H01L 23/66; H01L 21/76804; H01L 23/3121; H01L 21/4857; H01L 21/56; H01L 23/49822; H01L 2223/6644; H01L 23/49816; H01L 2223/6677
USPC ........................................................ 257/728
See application file for complete search history.

(56) References Cited

U.S. PATENT DOCUMENTS

| | | | | |
|---|---|---|---|---|
| 2003/0132433 | A1* | 7/2003 | Piner ................. | H01L 21/02538 257/E29.081 |
| 2008/0165011 | A1* | 7/2008 | Staff ................. | G06K 19/0723 340/572.7 |
| 2009/0309227 | A1* | 12/2009 | King ................. | H01L 21/76807 257/762 |
| 2013/0256912 | A1* | 10/2013 | Prueckl .................. | H01L 24/95 438/109 |
| 2018/0158787 | A1* | 6/2018 | Chang ............... | H01L 23/49822 |

(Continued)

OTHER PUBLICATIONS

OED definition of Definition of Cover. No Date.*

*Primary Examiner* — Hrayr A Sayadian
(74) *Attorney, Agent, or Firm* — FOLEY & LARDNER LLP

(57) ABSTRACT

The present disclosure provides a semiconductor device package. The semiconductor device package includes a dielectric layer. The semiconductor device package further includes an antenna structure disposed in the dielectric layer. The semiconductor device package further includes a semiconductor device disposed on the dielectric layer. The semiconductor device package further includes an encapsulant covering the semiconductor device. The semiconductor device package further includes a conductive pillar having a first portion and a second portion. The first portion surrounded by the encapsulant and the second portion embedded in the dielectric layer.

10 Claims, 39 Drawing Sheets

(56) References Cited

U.S. PATENT DOCUMENTS

2018/0166405 A1\* 6/2018 Chiang .................. H01L 24/82
2019/0279951 A1 9/2019 Chiang et al.

\* cited by examiner

SEMICONDUCTOR DEVICE PACKAGE AND THE METHOD OF MANUFACTURING THE SAME

BACKGROUND

1. Technical Field

The present disclosure generally relates to a semiconductor device package, and to a semiconductor device package including an antenna structure, and a method of manufacturing a semiconductor device package.

2. Description of the Related Art

Wireless communication devices such as mobile phones may include semiconductor device package(s) having an antenna for signal (e.g. radio frequency (RF) signals) transmission, such as Antenna on Package (AoP). The antenna is manufactured before being disposed on a substrate of the semiconductor device package. Therefore, a through via extending through the substrate of the semiconductor device package is necessary to connect the antenna and some electronic components. However, the onerous manufacture of the antenna and the through via results in a high cost of the semiconductor device package.

SUMMARY

In one or more embodiments, a semiconductor device package includes a dielectric layer. The semiconductor device package further includes an antenna structure disposed in the dielectric layer. The semiconductor device package further includes a semiconductor device disposed on the dielectric layer. The semiconductor device package further includes an encapsulant covering the semiconductor device. The semiconductor device package further includes a conductive pillar having a first portion and a second portion. The first portion is surrounded by the encapsulant and the second portion is embedded in the dielectric layer.

In one or more embodiments, a semiconductor device package includes a dielectric layer having a first surface and a second surface. The semiconductor device package further includes an antenna structure embedded in the dielectric layer. The semiconductor device package further includes a semiconductor device disposed on the first surface of the dielectric layer. The semiconductor device package further includes a conductive pillar having a first surface within the dielectric layer. The first surface of the conductive pillar and the first surface of the dielectric layer are discontinuous.

In one or more embodiments, a method of manufacturing a semiconductor package includes forming an antenna structure; forming a dielectric layer to cover the antenna structure; defining a hole in the dielectric layer to expose a portion of the antenna structure; forming a conductive pillar having a first portion in the hole to electrically connect to the exposed portion of the antenna structure and a second portion protruding from the dielectric layer; disposing a semiconductor device on the dielectric layer; forming an encapsulant to cover the semiconductor device and the second portion of the conductive pillar; and forming a redistribution layer on the encapsulant to electrically connect the conductive pillar with the semiconductor device.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
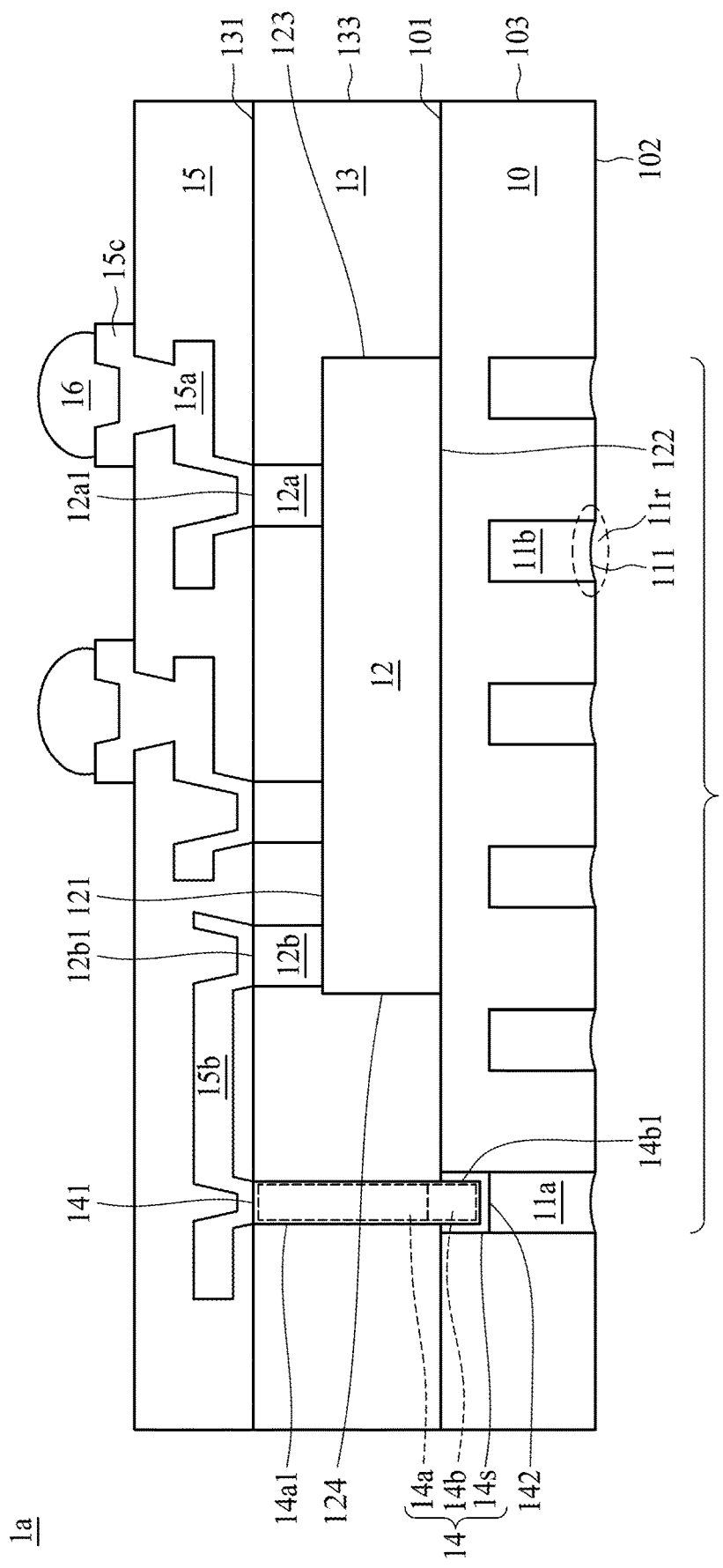
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1a in accordance with some embodiments of the present disclosure. The semiconductor device package 1a includes a dielectric layer 10, an antenna structure 11, a semiconductor device 12, an encapsulant 13, a conductive pillar 14, a redistribution layer (RDL) 15 and an electrical contact 16.

The dielectric layer 10 has a surface 101 and a surface 102 opposite the surface 101. The dielectric layer 10 may have a relatively low dielectric constant (Dk). The dielectric layer 10 may have a relatively low dissipation factor (Df). The dielectric layer 10 may have a relatively great coefficient of temperature expansion (CTE) compared with the encapsulant 13. The dielectric layer 10 may include, for example, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof.

The antenna structure 11 is disposed in the dielectric layer 10. The antenna structure 11 is embedded in the dielectric layer 10. The antenna structure 11 is recessed from the surface 102 of the dielectric layer 10. The antenna structure 11 is close to the surface 102 than to the surface 101. In some embodiments, the antenna structure 11 may not be exposed from the surface 101. In other words, the antenna structure 21 may be spaced apart from the semiconductor device 12. In some embodiments, a thickness of each of antenna elements 11a, 11b is less than a thickness of the dielectric layer 10. In some embodiments, the antenna structure 11 may include a conductive material such as a metal or metal alloy. Examples of the conductive material include gold (Au), silver (Ag), aluminum (Al), copper (Cu), or an alloy thereof.

The antenna structure 11 includes an antenna element 11a substantially aligned with the conductive pillar 14. The antenna element 11a may be disposed below the conductive pillar 14. The antenna element 11a is proximate to the conductive pillar 14. The antenna element 11a may be electrically connected to the conductive pillar 14. The antenna element 11a may be in direct contact with the conductive pillar 14. The antenna element 11a is recessed from the surface 102 of the dielectric layer 10. In some embodiments, the width of the antenna element 11a may be equal to or greater than the width of the conductive pillar. Alternatively, the width of the antenna element 11a may be smaller than the width of the conductive pillar 14. The antenna structure 11 includes one or more antenna elements 11b. The distance from the antenna elements 11b to the conductive pillar 14 is greater than the distance from the antenna element 11a to the conductive pillar 14. The antenna elements 11b are recessed from the surface 102 of the dielectric layer 10. The antenna elements 11b have a recess 11r located near the surface 102 of the dielectric layer 10. The antenna element 11b has a surface 111 exposed from the surface 102 of the dielectric layer 10. The surface 111 may include a burr pattern. The surface 111 may include a stripe pattern. The surface 111 may be nonplanar. As shown in FIG. 1A, the antenna element 11a may also have a recess similar to the recess 11r of the antenna elements 11b and has a surface similar to the surface 111 of the antenna elements 11b.

The semiconductor device 12 is disposed on the surface 101 of the dielectric layer 10. The semiconductor device 12 has a surface 121 (e.g., an active surface) facing away from the dielectric layer 10 and a surface 122 (e.g., a backside surface) opposite to the surface 121. The surface 122 of the semiconductor device 12 may be in contact with the dielectric layer 13. The semiconductor device 12 has a plurality of sides 123 and 124 extending between the surface 121 and the surface 122. The sides 123 and 124 are opposite to each other. The distance from the surface 121 to the surface 101 is greater than the distance from the surface 122 to the surface 101. The encapsulant 13 may surround and continuously, directly contact the plurality of sides 123 and 124 and the surface 121 of the semiconductor device 12. A conductive terminal 12a and a conductive terminal 12b are disposed on the surface 121 of the semiconductor device 12. The conductive terminal 12a has a surface 12a1 facing away from the semiconductor device 12. The conductive terminal 12b has a surface 12b1 facing away from the semiconductor device 12. The semiconductor device 11 is electrically connected with the RDL 15 via the conductive terminal 12a. The semiconductor device 11 is electrically connected with the RDL 15 via the conductive terminal 12b. The semiconductor device 12 may be, for example, a processor, a controller (e.g., a memory controller), a microcontroller (MCU), a memory die, a high-speed input/output device a radio frequency integrated circuit (RFIC) or other electronic components.

In some embodiments, a ground layer (not shown) may be disposed between the semiconductor device 12 and the antenna structure 11 to reflect the radiation from the antenna structure 11. The ground layer may be disposed on the dielectric layer 11. The ground layer may be embedded in the dielectric layer 11.

The encapsulant 13 is disposed on the surface 101 of the dielectric layer. The encapsulant 13 may be in direct contact with the dielectric layer 10. The encapsulant 13 has a surface 131 facing away from the dielectric layer 10. The dielectric layer 10 has a lateral surface 103 and the encapsulant 13 has a lateral surface 133. The lateral surface 103 and the lateral surface 133 are substantially coplanar. The encapsulant 13 covers the semiconductor device 12. The encapsulant 13 surrounds the conductive terminal 12a and the conductive terminal 12b. The encapsulant 13 can include epoxy. The encapsulant 13 can include underfill material. The encapsulant 13 can include molding compound (e.g. epoxy molding compound (EMC)) or encapsulation material. The encapsulant 13 may have a Dk greater than that of the dielectric layer 10. The encapsulant 13 may have a Df greater than that of the dielectric layer 10. The encapsulant 13 may have a CTE smaller than that of the dielectric layer 10.

In some comparative embodiments, the antenna structure 11 may be embedded in the encapsulant 13 or a similar material having a relatively great Df and a relatively great Dk. The encapsulant 13 or the material with the relatively great Df and the relatively great Dk deteriorates the transmission speed and causes a significant transmission loss (or signal loss) between the antenna structure 11 and one or more external signal sources. In some embodiments of the present disclosure, the antenna structure 11 embedded in the dielectric layer 10 having a Dk lower than that of the encapsulant 13 and a Df lower than that of the encapsulant 13 can significantly improve the transmission rate and reduce the transmission loss from the antenna structure 11 to one or more external signal sources and vice versa. Furthermore, the lateral surface 103 of the dielectric layer 10 is substantially coplanar with the lateral surface 133 of the encapsulant 13, i.e., the lateral surface 103 is exposed and can increase the radiation efficiency (or antenna efficiency) of the antenna structure 11 in the lateral direction. Additionally, the dielectric layer 10 having a relatively great CTE may alleviate the warpage of the semiconductor device package 1a.

The conductive pillar 14 extends through the encapsulant 13 from the antenna element 11a of the antenna structure 11 toward the RDL 15. The conductive pillar 14 is electrically connected to the antenna element 11a. In some embodiments, an interface between the conductive pillar 14 and the antenna element 11a is within the dielectric layer 10. For example, the interface between the conductive pillar 14 and the antenna element 11a is located between the surface 101 and the surface 102 of the dielectric layer 10. The conductive pillar 14 may function as a feeding element to transmit a signal to the antenna structure 11 or to receive a signal from the antenna structure 11. The conductive pillar 14 provides a transmission path and/or a receiving path between the semiconductor device 12 and the antenna structure 11. In a comparative embodiment, a semiconductor device package includes a pre-manufactured antenna, a pre-manufactured electronic component, a substrate and a through via. The pre-manufactured antenna is disposed on a surface of a substrate and covered with a compound. The pre-manufactured electronic component is disposed on another surface of the substrate and covered with another compound. The through via extends through the substrate and compounds to provide a connection path between the pre-manufactured electronic component and the pre-manufactured antenna. However, the manufacturing process of the packaging for the pre-manufactured antenna and the pre-manufactured electronic component, and the manufacturing process for forming the through via are both onerous and costly. Furthermore, the transmission efficiency of the pre-manufactured antenna may be deteriorated by the compound which has relatively high Dk and Df. In some embodiments, the present disclosure provides the antenna structure 11 embedded in the dielectric layer 10 with relatively low Dk and Df for better transmission efficiency. The conductive pillar 14 can provide a shorter transmission path between the antenna structure 11 and the semiconductor device 12 as compared with the through via of the comparative embodiments. Furthermore, the integration of the antenna structure 11 and the dielectric layer 10 can reduce the total size of the semiconductor device package 1a.

The conductive pillar 14 has a surface 141 facing away from the dielectric layer 10. The surface 141 and the surface of 131 of the encapsulant 13 are substantially coplanar. The surface 141 and the surface 12a1 of the conductive terminal 12a are substantially at the same elevation. In some embodiments, the surface 141 and the surface 131 may be discontinuous. In some embodiments, the surface 141 and the surface 12a1 may be discontinuous. The conductive pillar 141 includes a surface 142 opposite to the surface 141. The surface 142 is within the dielectric layer 10. The surface 142 and the surface 101 of the dielectric layer are discontinuous. In some embodiments, the surface 142 may be lower than the surface 101. The surface 142 may be in direct contact with the antenna element 11a of the antenna structure 11.

The conductive pillar 14 includes a portion 14a, a portion 14b, and a seed layer 14s. The portion 14a is surrounded by the encapsulant 13. The portion 14a has a lateral surface 14a1 surrounded by and in direct contact with the encapsulant 13. The portion 14b is embedded in the dielectric layer 10. The portion 14b is surrounded by the seed layer 14s. The portion 14b has a lateral surface 14b1 surrounded by and in direct contact with the seed layer 14s. The lateral surface 14a1 and the lateral surface 14b1 are substantially coplanar. The seed layer 14s is disposed along the surface 142 of the conductive pillar 14. The seed layer 14s is disposed between the portion 142 and the antenna element 11a of the antenna structure 11. The seed layer 14s is surrounded by and in direct contact with the dielectric layer 10. The conductive pillar 14 may include, for example, but is not limited to, nickel, copper, gold, platinum, titanium or other suitable metal material(s).

The RDL 15 includes a redistribution structure (or an interconnection layer) 15a and a redistribution structure 15b, and a conductive pad 15c. The redistribution structure 15a has a portion in direct contact with the surface 12a1 of the conductive terminal 12a. The redistribution structure 15a is electrically connected the conductive terminal 12a with the conductive pad 15c. The redistribution structure 15b has a portion in direct contact with the surface 12b1 of the conductive terminal 12b. The redistribution structure 15b has another portion in direct contact with the surface 141 of the conductive pillar 14. The redistribution structure 15b of the RDL 15 electrically connects the conductive pillar 14 to the conductive terminal 12b, which in turn electrically connects to the semiconductor device 12.

The RDL 15 can include a fan-out structure. The RDL 15 may include insulation material(s) or dielectric material(s) (not denoted in FIG. 1A). The RDL 15 can include a core or relatively hard material. The redistribution layer RDL 15 can include flexible or relatively soft material. The redistribution structure 15a and the redistribution structure 15b may each include a single-layer structure or a multi-layer structure. The redistribution structure 15a and 15b each may include a seed layer. The redistribution structure 15a and the redistribution structure 15b may each include some conductive elements, for example, but is not limited to, conductive trace(s), pad(s), contact(s), via(s). The conductive pad 15c may include material similar to that of the redistribution structure 15a and the redistribution structure 15b. The conductive pad 15c may include a material different from that of the redistribution structure 15a and the redistribution structure 15b.

The electrical contact 16 is disposed on the conductive pad 15c. The electric contact 16 is in direct contact with the conductive pad 15c. The electrical contact 16 is electrically connected with the semiconductor via the RDL 15. The electrical contact 16 can provide electrical connections between the semiconductor package device 1a and external components (e.g. external circuits or circuit boards). The electrical contact 16 may include a solder ball or a solder bump. In some embodiments, the electrical contact 16 may include a controlled collapse chip connection (C4) bump, a ball grid array (BGA) or a land grid array (LGA).

Figure 1B:
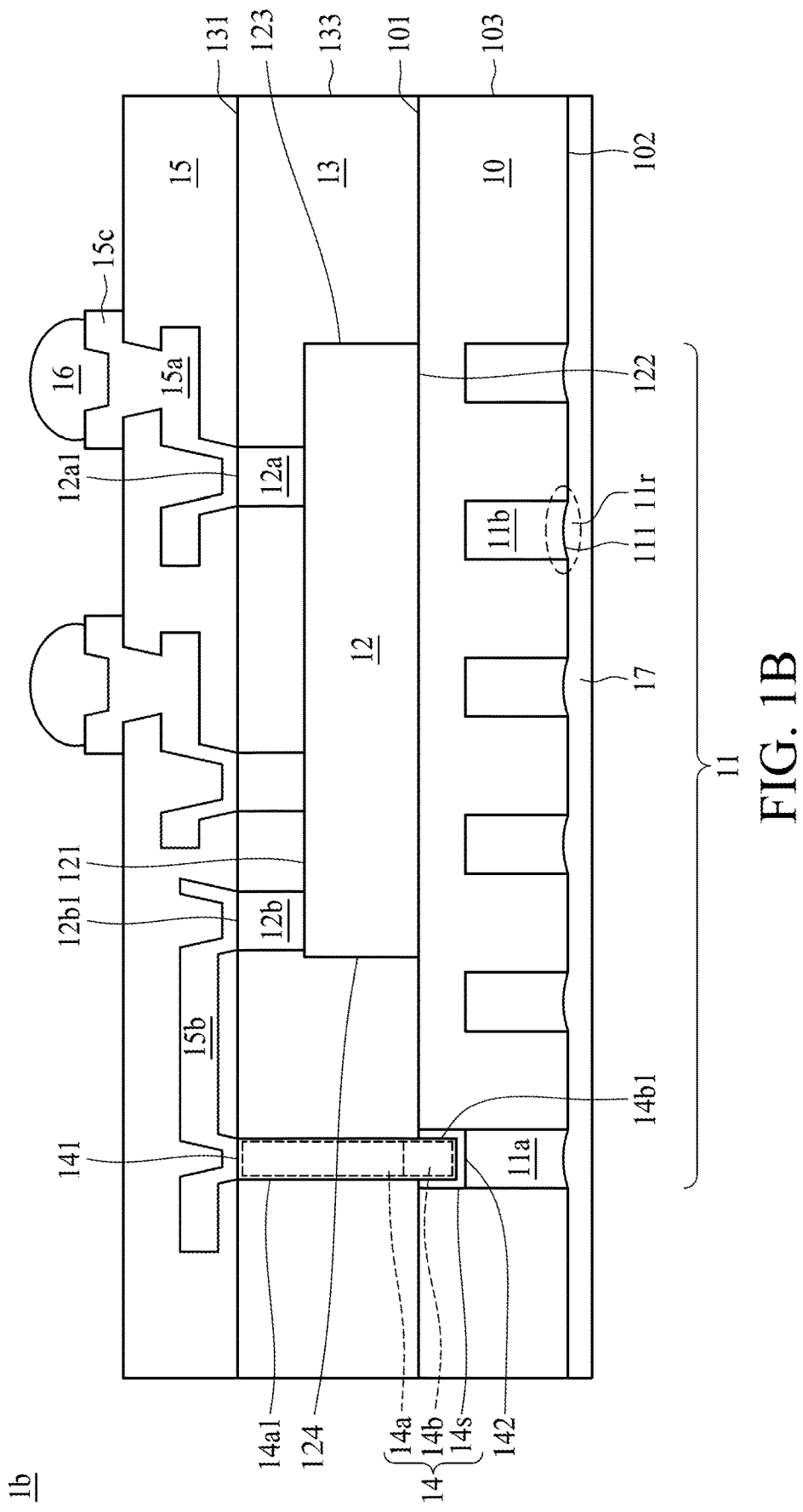
FIG. 1B illustrates a cross-sectional view of a semiconductor device package in accordance with some embodiments of the present disclosure.

FIG. 1B illustrates a cross-sectional view of a semiconductor device package 1b in accordance with some embodiments of the present disclosure. The semiconductor device package 1b of FIG. 1B is similar to the semiconductor device package 1a of FIG. 1A and the differences therebetween are described below.

The semiconductor device package 1b further includes a protection layer 17 disposed on the antenna structure 11. The protection layer 17 is disposed on the surface 102 of the dielectric layer 10. The protection layer 17 may be in direct contact with the antenna element 11a and the antenna elements 11b of the antenna structure 11. The protection layer 17 has a portion in the recess 11r. The protection layer 17 may be in direct contact with the surface 111. The protection layer 17 may, for example, include polymer material or photoresist dry film. The protection layer 17 protects the antenna structure 11 from oxidation.

Figure 2A:
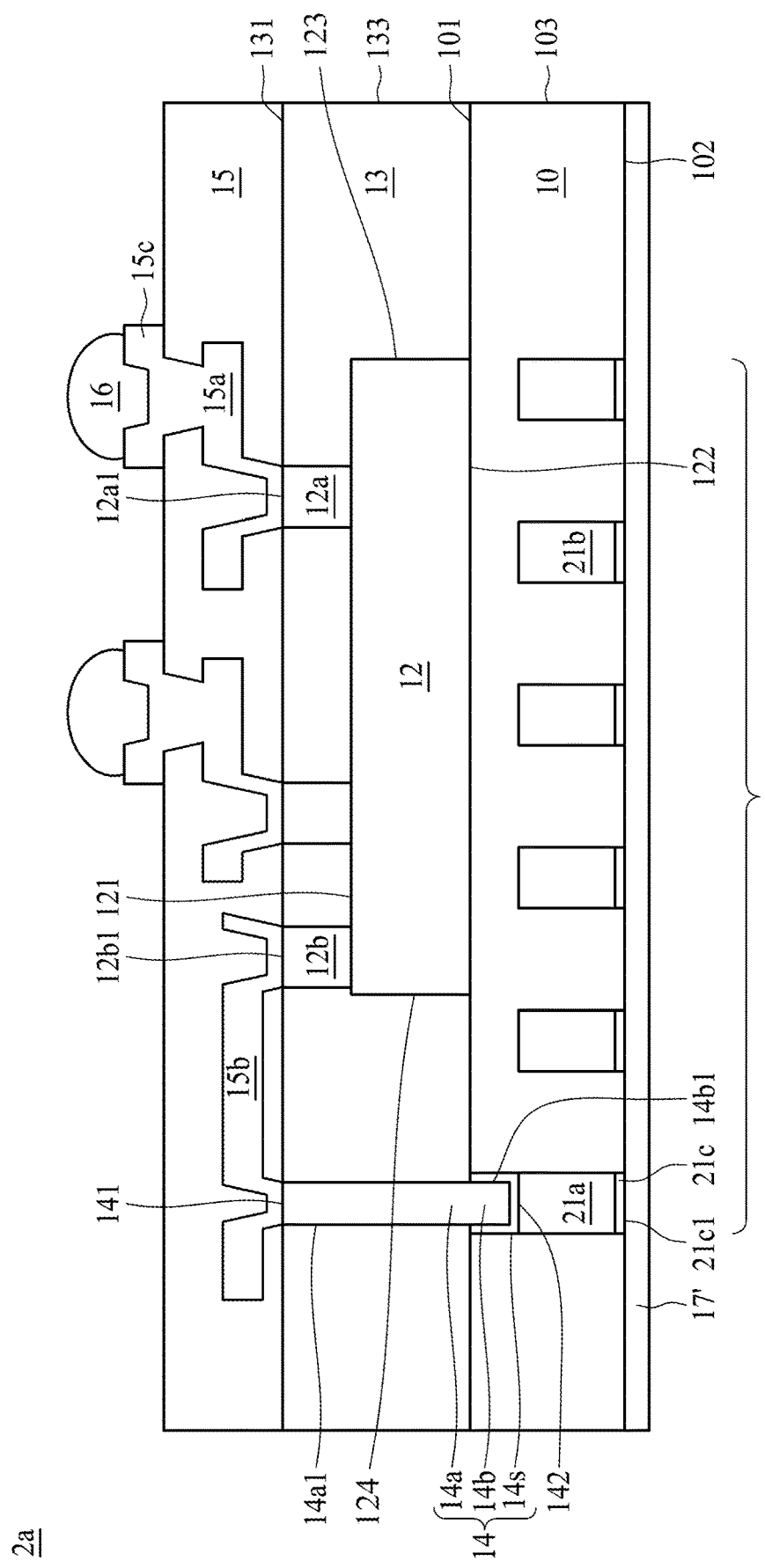
FIG. 2A illustrates a cross-sectional view of a semiconductor device package in accordance with some embodiments of the present disclosure.

FIG. 2A illustrates a cross-sectional view of a semiconductor device package 2a in accordance with some embodiments of the present disclosure. The semiconductor device package 2a of FIG. 2A is similar to the semiconductor device package 1a of FIG. 1A and the differences therebetween are described below.

The semiconductor device package 2a includes an antenna structure 21 and protection layer 17' rather than the antenna structure 11 and protection layer 17 of the semiconductor device package 1a. The antenna structure 21 is disposed in the dielectric layer 10. The antenna structure 21 is embedded in the dielectric layer 10. In some embodiments, the antenna structure 21 may not be exposed from the surface 101. In other words, the antenna structure 21 may be spaced apart from the semiconductor device 12. In some embodiments, a thickness of each of antenna elements 21a, 21b is less than a thickness of the dielectric layer 10. In some embodiments, the antenna structure 21 may include a conductive material such as a metal or metal alloy. Examples of the conductive material include gold (Au), silver (Ag), aluminum (Al), copper (Cu), titanium (Ti), or an alloy thereof.

The antenna structure 21 includes an antenna element 21a substantially aligned with the conductive pillar 14. The antenna element 21a may be disposed below the conductive pillar 14. The antenna element 21a is proximate to the conductive pillar 14. The antenna element 21a may be electrically connected to the conductive pillar 14. The antenna element 21a may be in direct contact with the conductive pillar 14. In some embodiments, the width of the antenna element 21a may be equal to or greater than the width of the conductive pillar. Alternatively, the width of the antenna element 21a may be smaller than the width of the conductive pillar 14. The antenna structure 21 includes one or more antenna elements 21b. The distance from the antenna elements 21b to the conductive pillar 14 is greater than the distance from the antenna element 21a to the conductive pillar 14. The antenna structure 21 includes a seed layer 21c. The seed layer 21c is disposed between the antenna structure 21 and the protective layer 17'. The seed layer 21c has a surface 21c1 in direct contact with the protection layer 17'. The surface 21c1 may be substantially planar. The surface 21c1 and the surface 102 of the dielectric layer 10 are substantially coplanar.

The protection layer 17' may, for example, include polymer material or photoresist dry film. The protection layer 17' protects the antenna structure 11 from oxidation.

Figure 2B:
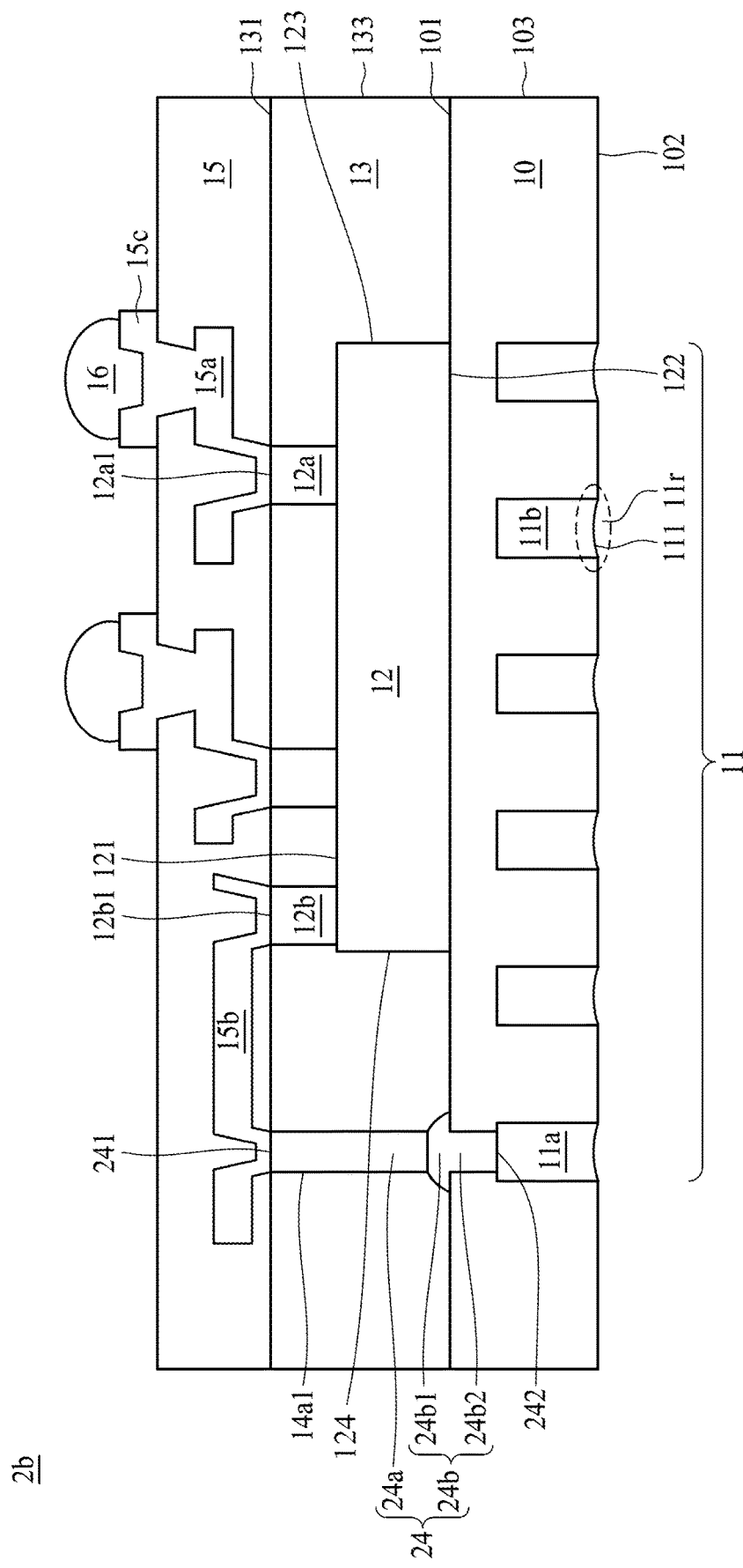
FIG. 2B illustrates a cross-sectional view of a semiconductor device package in accordance with some embodiments of the present disclosure.

FIG. 2B illustrates a cross-sectional view of a semiconductor device package in accordance with some embodiments of the present disclosure. The semiconductor device package 2b of FIG. 2B is similar to the semiconductor device package 1a of FIG. 1A and the differences therebetween are described below.

The semiconductor device package 2b includes a conductive structure 24 (or a conductive pillar) rather than the conductive pillar 14 of the semiconductor device package 1a. The conductive structure 24 electrically connects the antenna element 11a of the antenna structure 11 to the redistribution structure 15b, which in turn electrically connects with the semiconductor device 12 via the conductive terminal 12b. The conductive structure 24 extends through the encapsulant 13 from the antenna element 11a of the antenna structure 11 toward the RDL 15. The conductive structure 24 is electrically connected to the antenna element 11a. In some embodiments, an interface between the conductive structure 24 and the antenna element 11a is within the dielectric layer 10. For example, the interface between the conductive structure 24 and the antenna element 11a is located between the surface 101 and the surface 102 of the dielectric layer 10. The conductive structure 24 may function as a feeding element to transmit a signal to the antenna structure 11 or to receive a signal from the antenna structure 11. The conductive structure 24 provides a transmission path and/or a receiving path between the semiconductor device 12 and the antenna structure 11. The conductive structure 24 can provide a shorter transmission path between the antenna structure 11 and the semiconductor device 12 as compared with the through via of the comparative embodiments.

The conductive structure 24 has a surface 241 facing away from the dielectric layer 10 and a surface 242 opposite to the surface 241. The surface 241 and the surface 131 are substantially coplanar. The surface 241 and the surface 12a1 or the surface 12b1 are substantially at the same elevation. In some embodiments, the surface 241 and the surface 131 may be discontinuous. In some embodiments, the surface 241 and the surface 12a1 may be discontinuous. The surface 242 is within the dielectric layer 10. The surface 242 and the surface 101 are discontinuous. The surface 242 is in direct contact with the antenna element 11a of the antenna structure 11.

The conductive structure 24 includes a conductive element 24a and an electrical contact 24b. The conductive element 24a disposed on the electrical contact 24b. The conductive element 24a is surrounded by the encapsulant 13. The conductive element may include, for example, but is not limited to, nickel, copper, gold, platinum, titanium or other suitable metal material(s). The electrical contact 24b (e.g. a solder ball or solder bump) has a portion 24b1 protruding from the surface 101 of the dielectric layer 10. The portion 24b1 covers a part of the surface 101. The portion 24b1 may have a curved surface. The electrical contact 24b has a portion 24b2 embedded in the dielectric layer 10. In some embodiments, an intermetallic compound (IMC) may be disposed between the electrical contact 24b and the antenna element 11a. In some embodiments, an IMC may be disposed between the electrical contact 24b and the conductive element 24a.

Figure 3:
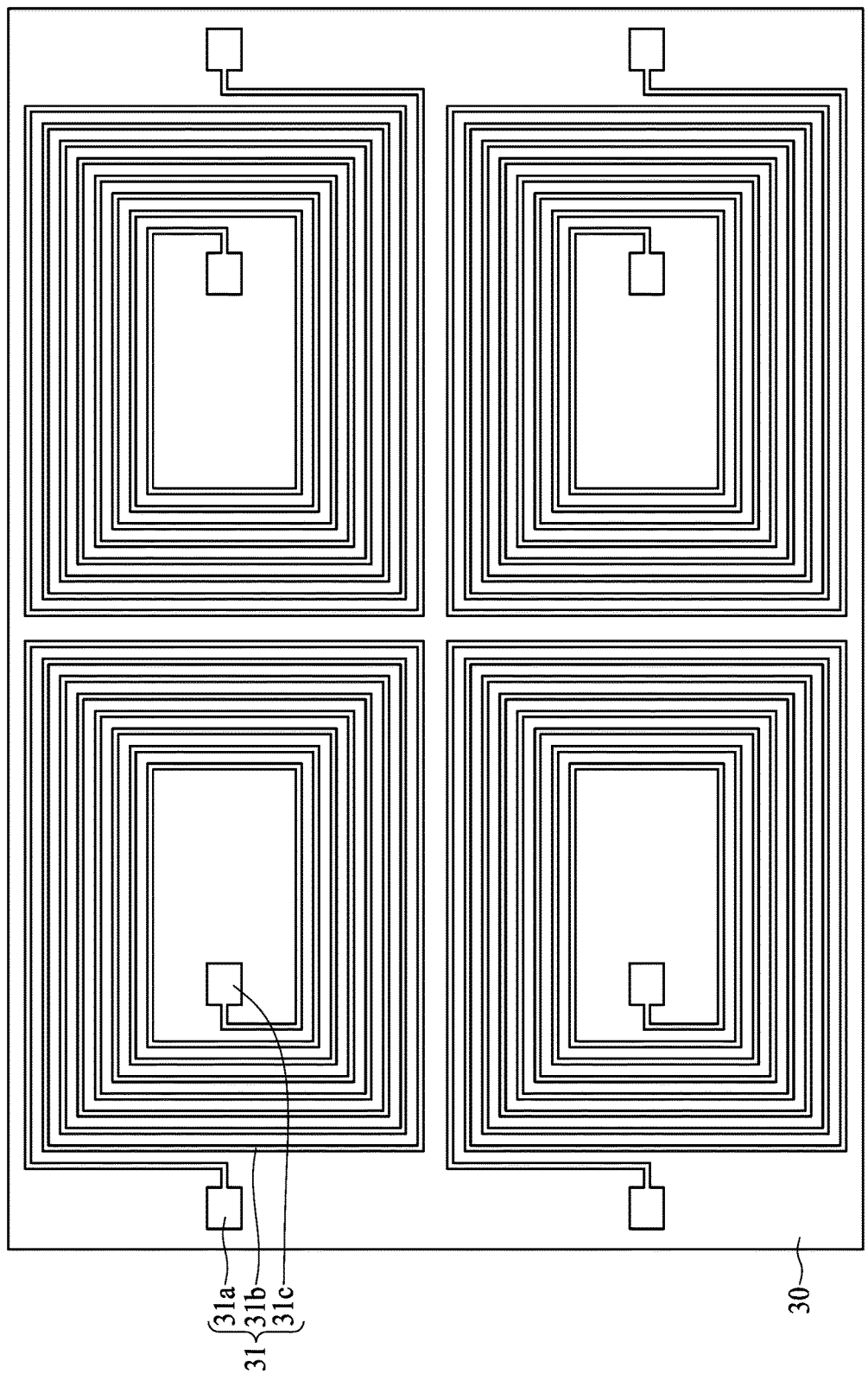
FIG. 3 illustrates a bottom view of a semiconductor device package in accordance with some embodiments of the present disclosure.

FIG. 3 illustrates a bottom view of a semiconductor device package 3 in accordance with some embodiments of the present disclosure. The semiconductor device package 3 includes a dielectric layer 30 and an antenna structure 31.

The dielectric layer 30 may have a relatively low Dk. The dielectric layer 30 may have a relatively low Df. The dielectric layer 30 may have a relatively great CTE. The dielectric layer 30 may include, for example, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof.

The antenna structure 31 is embedded in the dielectric layer 30. The antenna structure 31 includes an antenna element 31a, an antenna element 31b, and an antenna element 31c. The antenna element 31a may connect a feeding element (e.g. the conductive pillar 14 in FIG. 1A). The antenna element 31a may connect to a ground wire. The antenna element 31b may include a meander-like pattern. The antenna element 31b may include a concentric-rect-angle-like pattern. The antenna element 31c may connect a feeding element (e.g. the conductive pillar 14 in FIG. 1A). The antenna element 31c may connect to a ground wire. The antenna structure 31 may have different antenna elements, for example, but not limited to, a patch antenna, a squirrel-cage antenna, planar inverted-F antenna, etc.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, FIG. 4P, FIG. 4Q, FIG. 4R, FIG. 4S and FIG. 4T illustrate one or more stages of a method for manufacturing a semiconductor device package in accordance with some embodiments of the subject application.

Figure 4A:
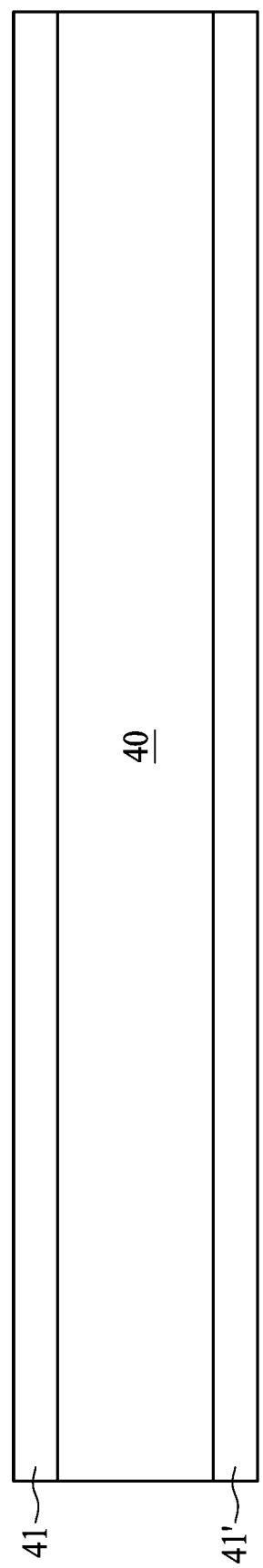
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, FIG. 4P, FIG. 4Q, FIG. 4R, FIG. 4S and FIG. 4T illustrate one or more stages of a method for manufacturing a semiconductor device package in accordance with some embodiments of the subject application.

Referring to FIG. 4A, a substrate 40 is provided. The substrate 40 may include a panel substrate. A conductive layer 41 is formed on the substrate 40 in, for example, an electroplating process. A conductive layer 41' is formed on the substrate 40 opposite to the conductive layer 41 in, for example, an electroplating process. In some embodiments, the conductive layer 41 and the conductive layer 41' may be formed in the same electroplating process.

Figure 4B:
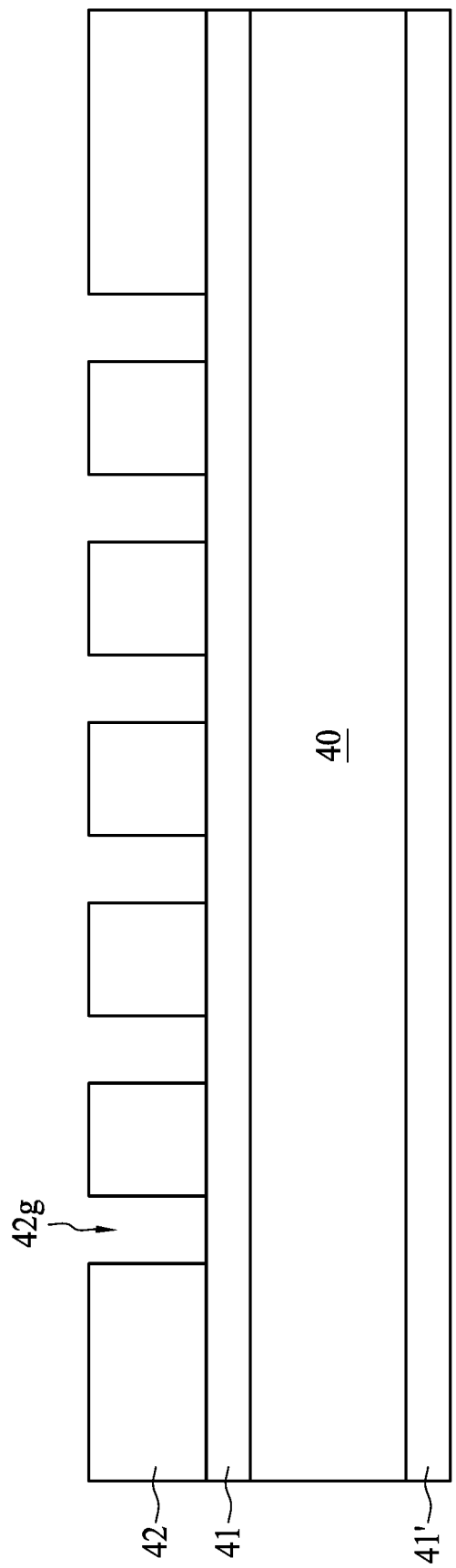
Figure 4C:
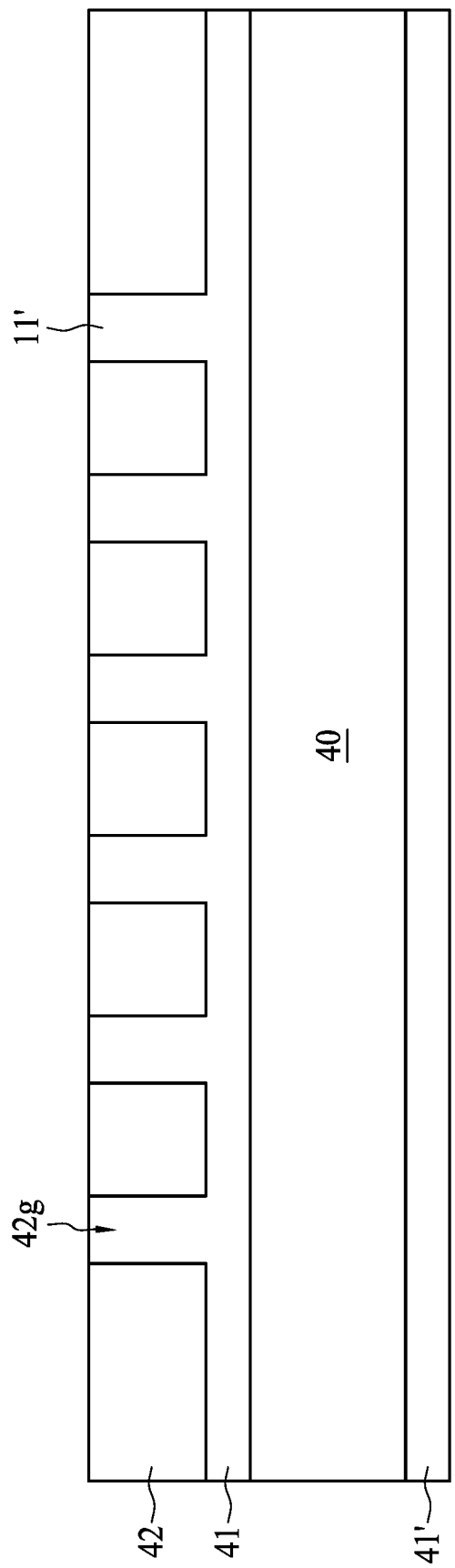
Figure 4D:
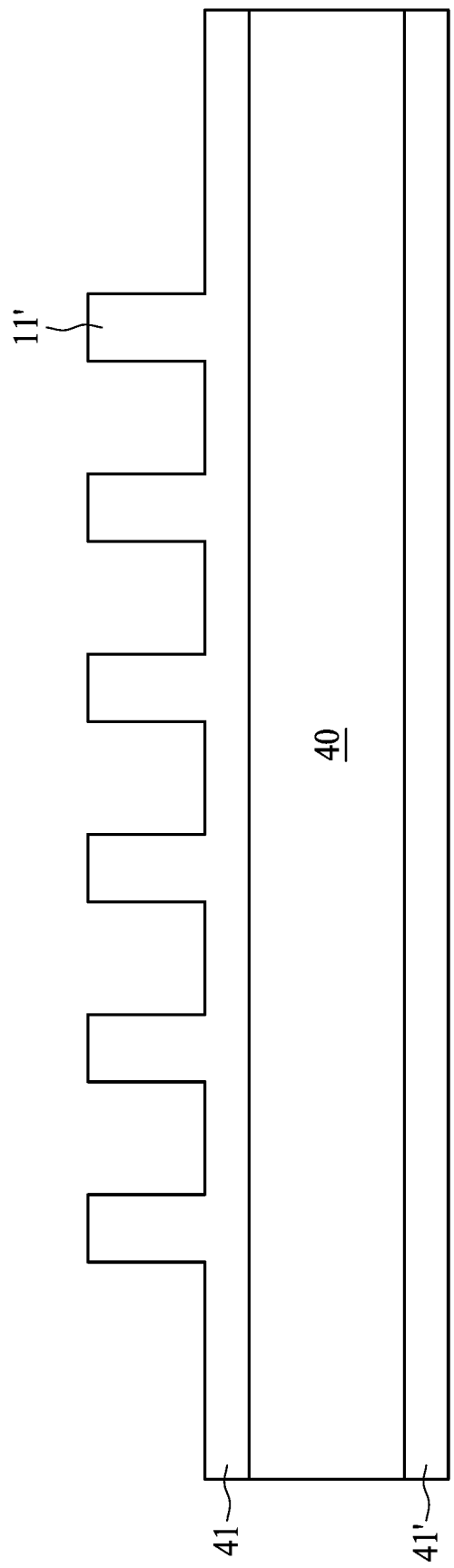

Referring to FIG. 4B, a photoresist layer 42 is formed on the conductive layer 41 by, for example, a coating process followed by an exposure process. The photoresist 42 defines a gap 42g on the conductive layer 41. Referring to FIG. 4C, an antenna structure 11' is formed within the gap 42g in, for example, an electroplating process and supported by the conductive layer 41. The antenna structure 11' may have a height substantially the same as that of the photoresist layer 42. Referring to FIG. 4D, the photoresist layer 42 is removed by, for example, a plasma ashing process.

Figure 4E:
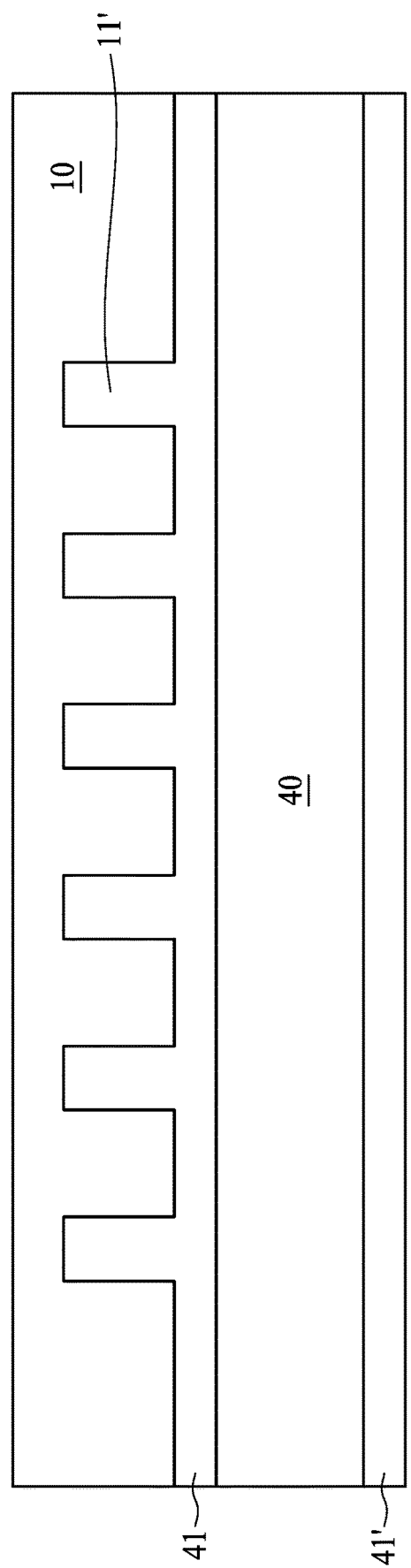
Figure 4F:
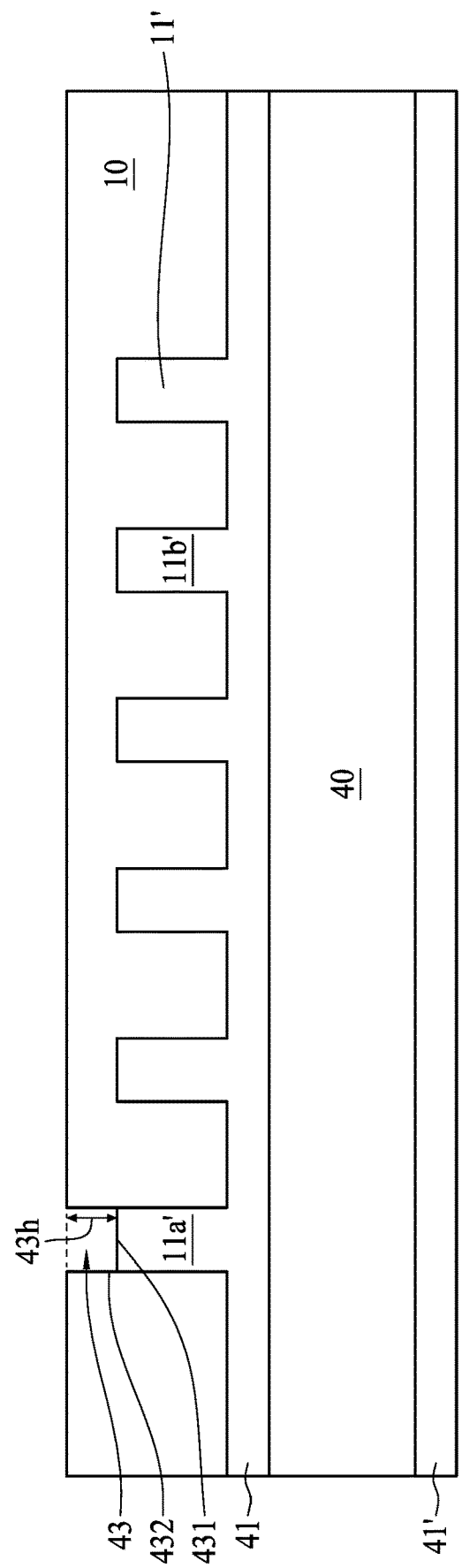

Referring to FIG. 4E, a dielectric layer 10 is formed on the antenna structure 11' and the conductive layer 41 in, for example, a coating process followed by a grinding process. The dielectric layer 10 surrounds the antenna structure 11'. Referring to FIG. 4F, a hole 43 is defined in the dielectric layer 10 in, for example, a laser drilling process, to expose a portion 11a' of the antenna structure 11', while other portions 11b' of the antenna structure 11' are covered by the dielectric layer 10. The hole 43 has a surface 431 exposed to the portion 11a'. The hole 43 has a lateral surface 432 exposed to the dielectric layer 10. The hole 43 has a height 43h relative to a top surface of the portion 11a'.

Figure 4G:
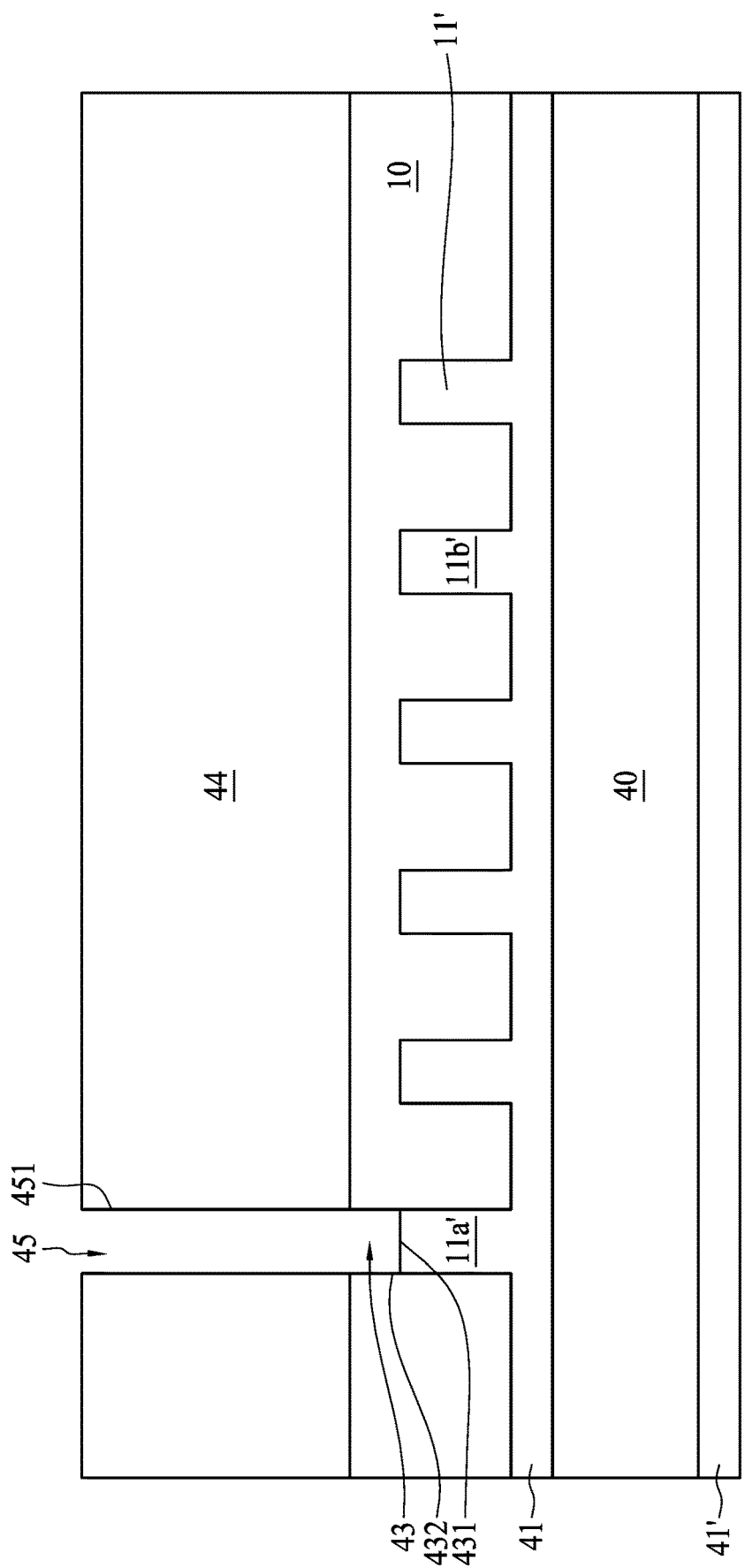
Figure 4H:
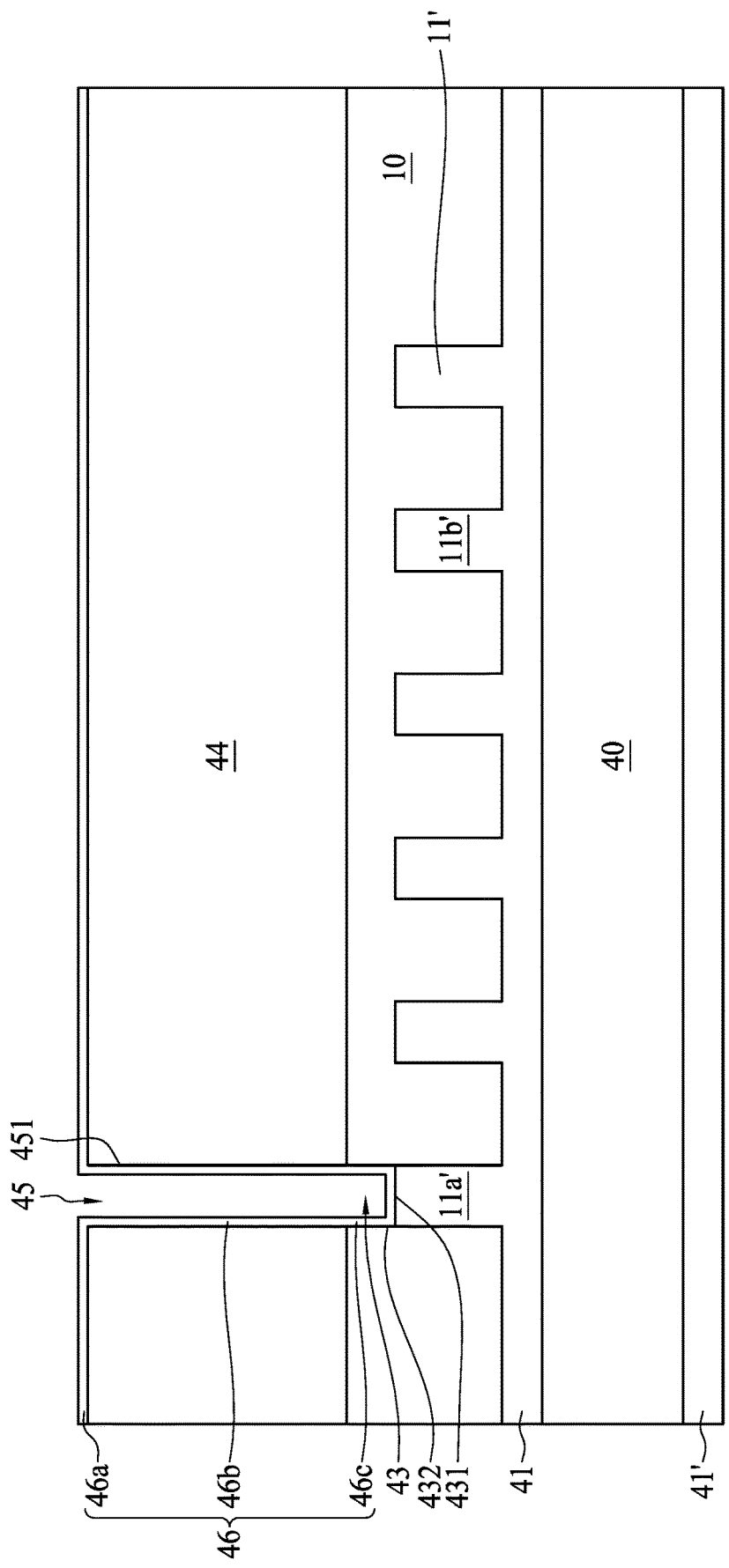

Referring to FIG. 4G, a photoresist layer 44 is formed on the dielectric layer 10 in, for example, a coating process. The photoresist layer 44 is patterned to define a through-via 45 exposing the hole 43 in, for example, an exposure process. The through-via 45 has a lateral surface 451 exposed to the photoresist layer 44. Referring to FIG. 4H, a seed layer 46 is formed on the photoresist layer 44 and along the lateral surface 451, the lateral surface 432 and the surface 431 in, for example, a sputtering process. The seed layer 46 includes a portion 46a on the photoresist layer 44, a portion 46b along the lateral surface 451 and a portion 46c along the surface 431 and lateral surface 432.

Figure 4I:
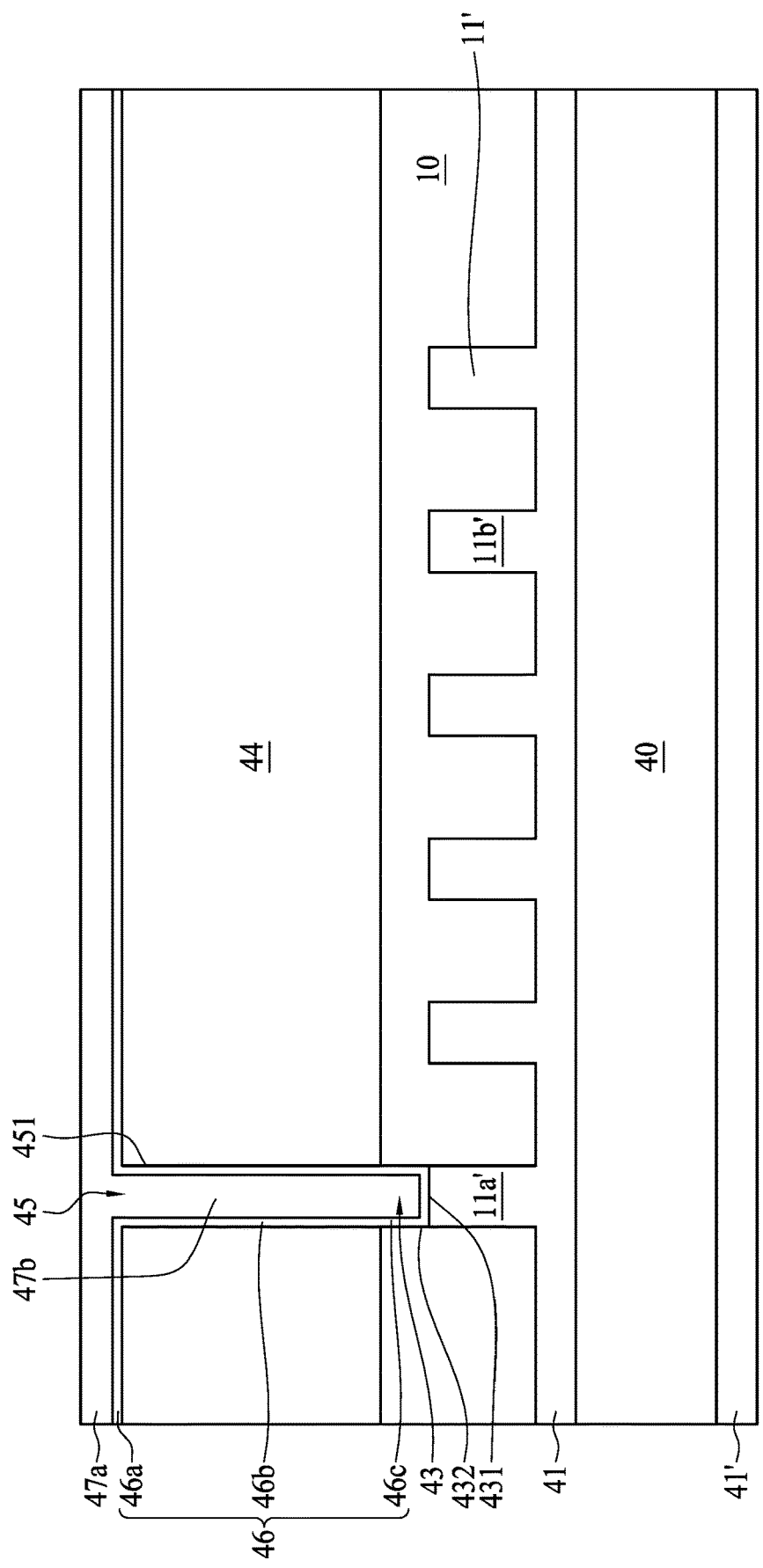
Figure 4J:
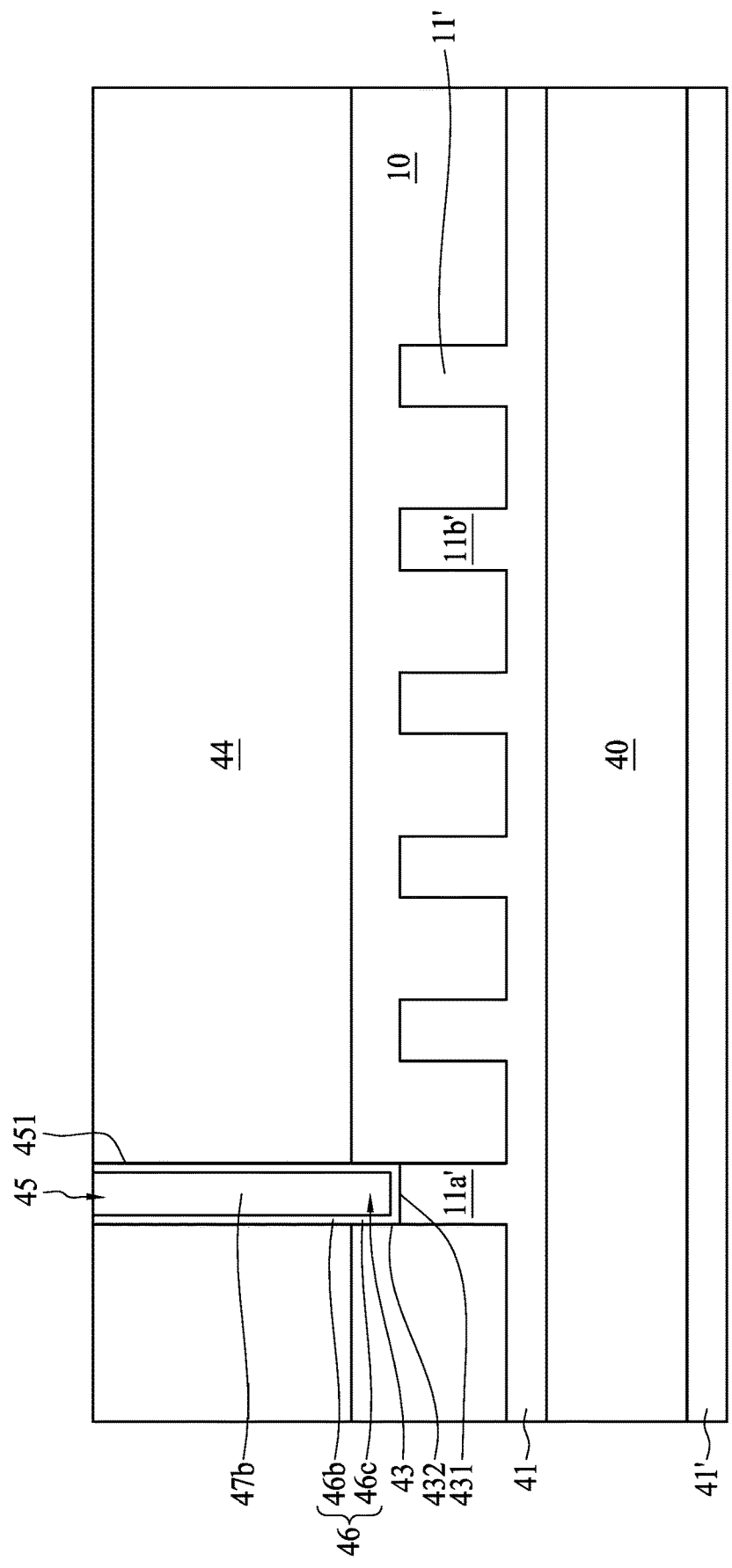
Figure 4K:
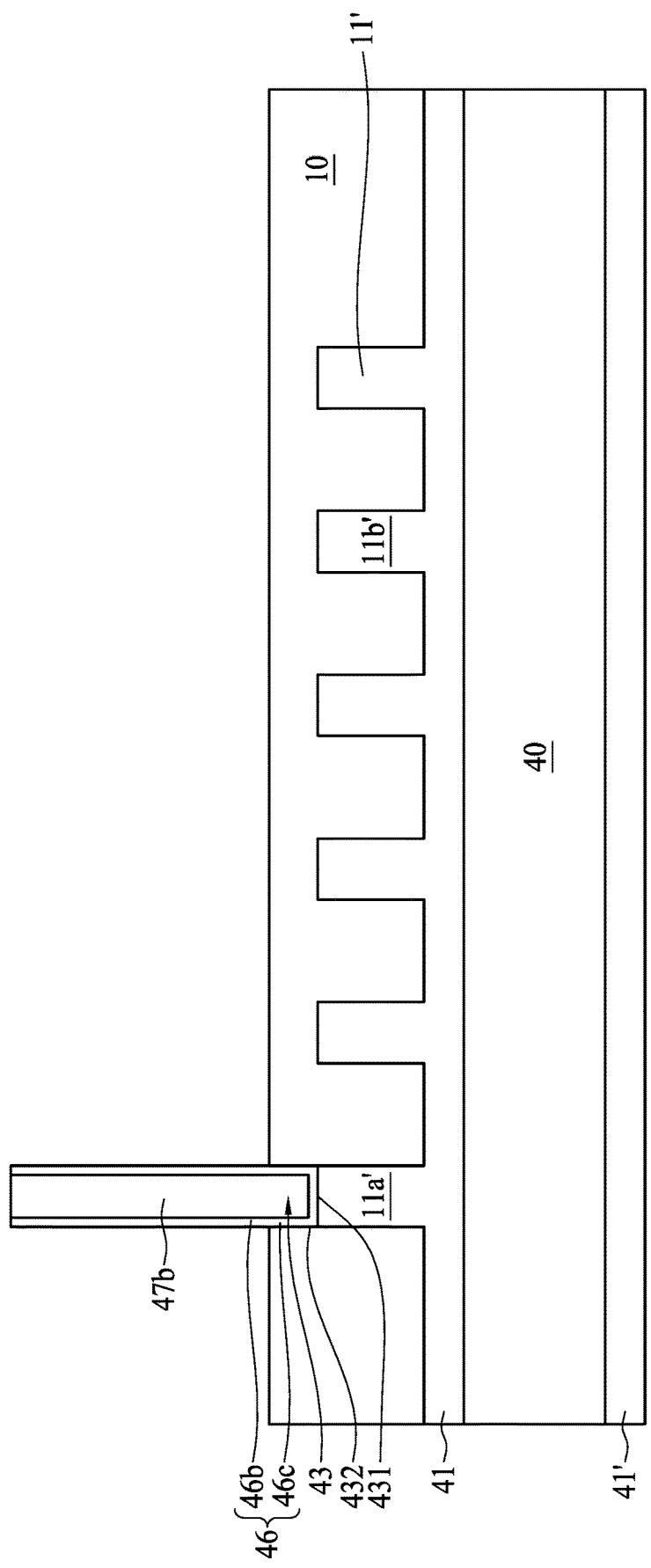
Figure 4L:
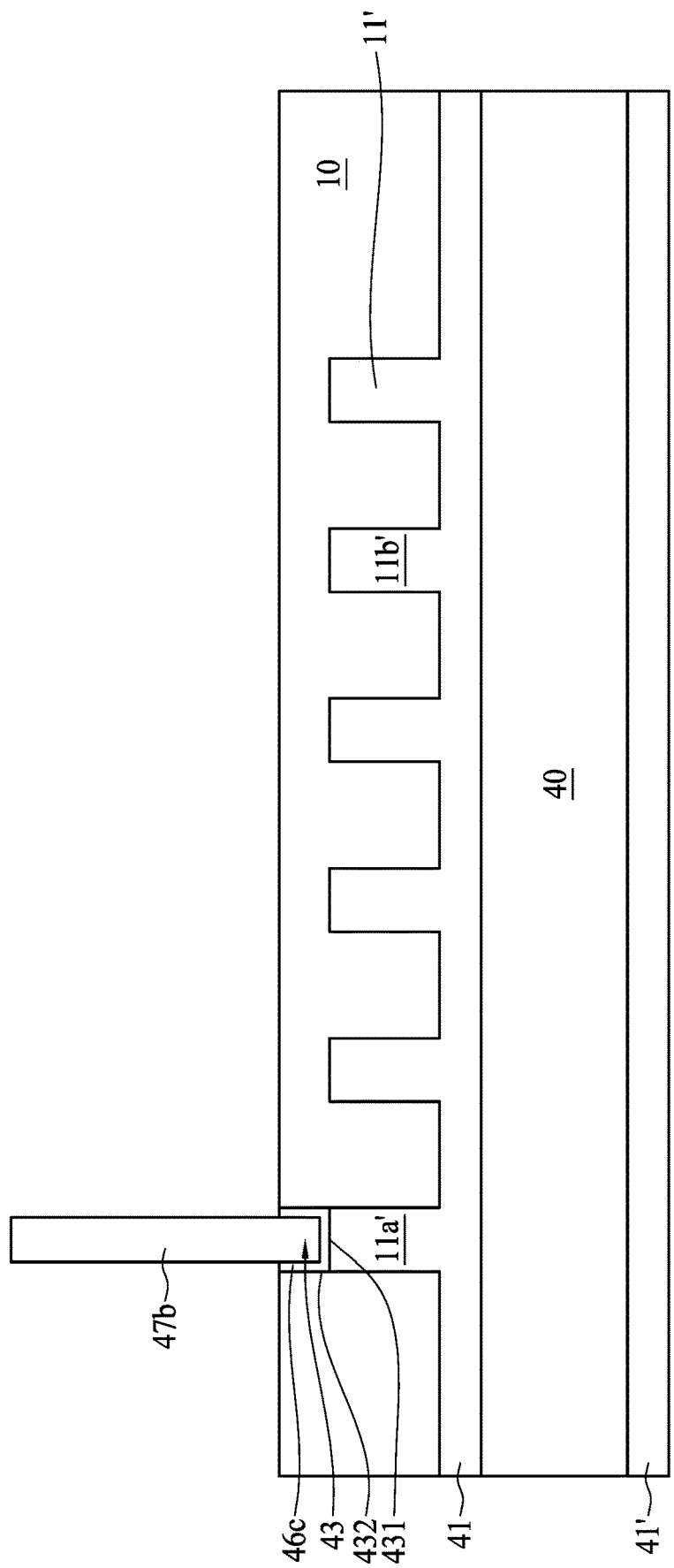

Referring to FIG. 4I, a conductive layer 47a is formed on the portion 46a of the seed layer 46 in, for example, an electroplating process. A conductive pillar 47b is formed within the through-via 45 and the hole 43 in, for example, an electroplating process. Referring to FIG. 4J, the conductive layer 47a and the portion 46a of the seed layer 46 are removed by, for example, an etching process. In some embodiment, a portion of the photoresist layer 44, a part of the conductive pillar 47b or a part of the portion 46b may be removed in the etching process. Referring to FIG. 4K, the photoresist layer 44 is removed by, for example, a plasma ashing process. Referring to FIG. 4L, the portion 46b is removed by, for example, an etching process.

Figure 4M:
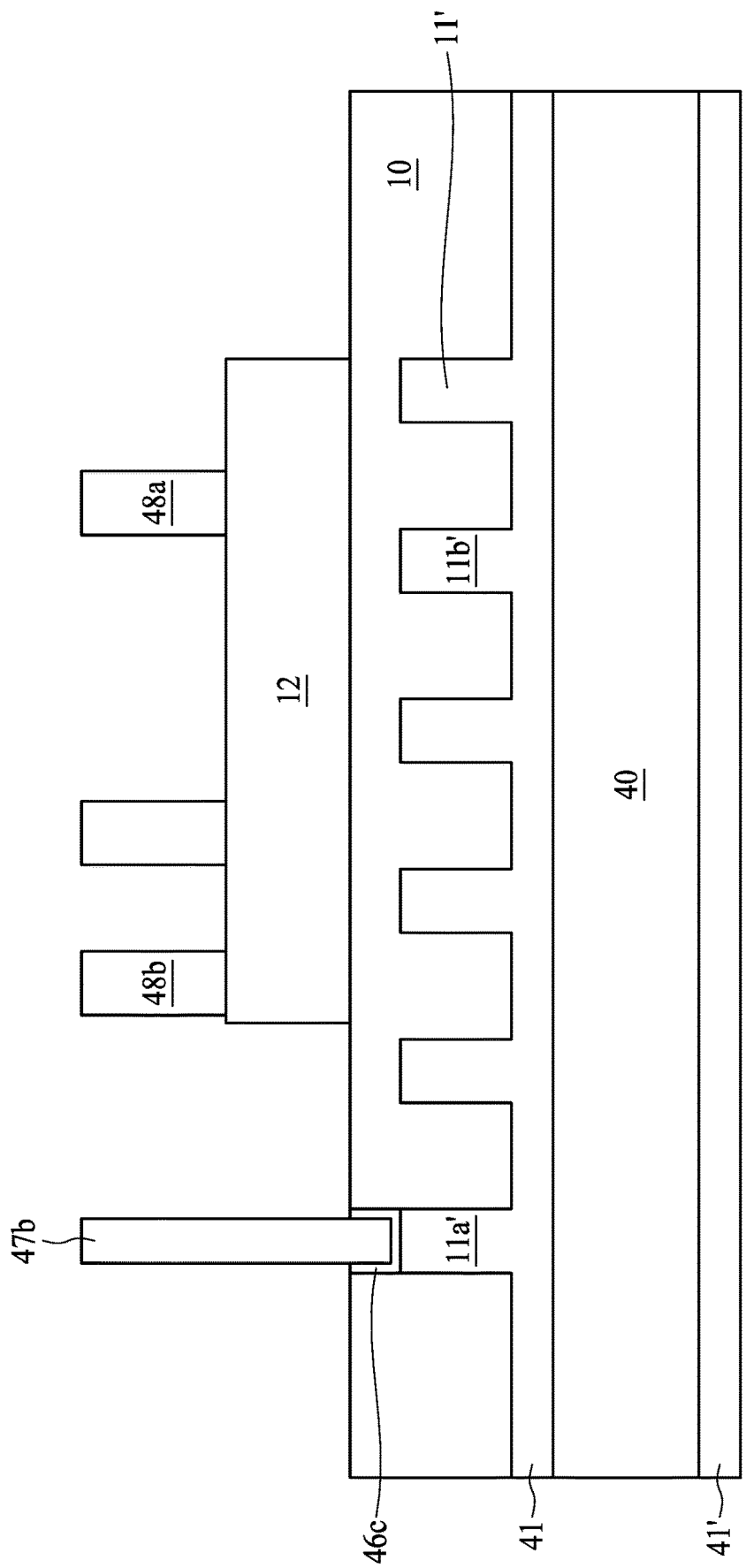
Figure 4N:
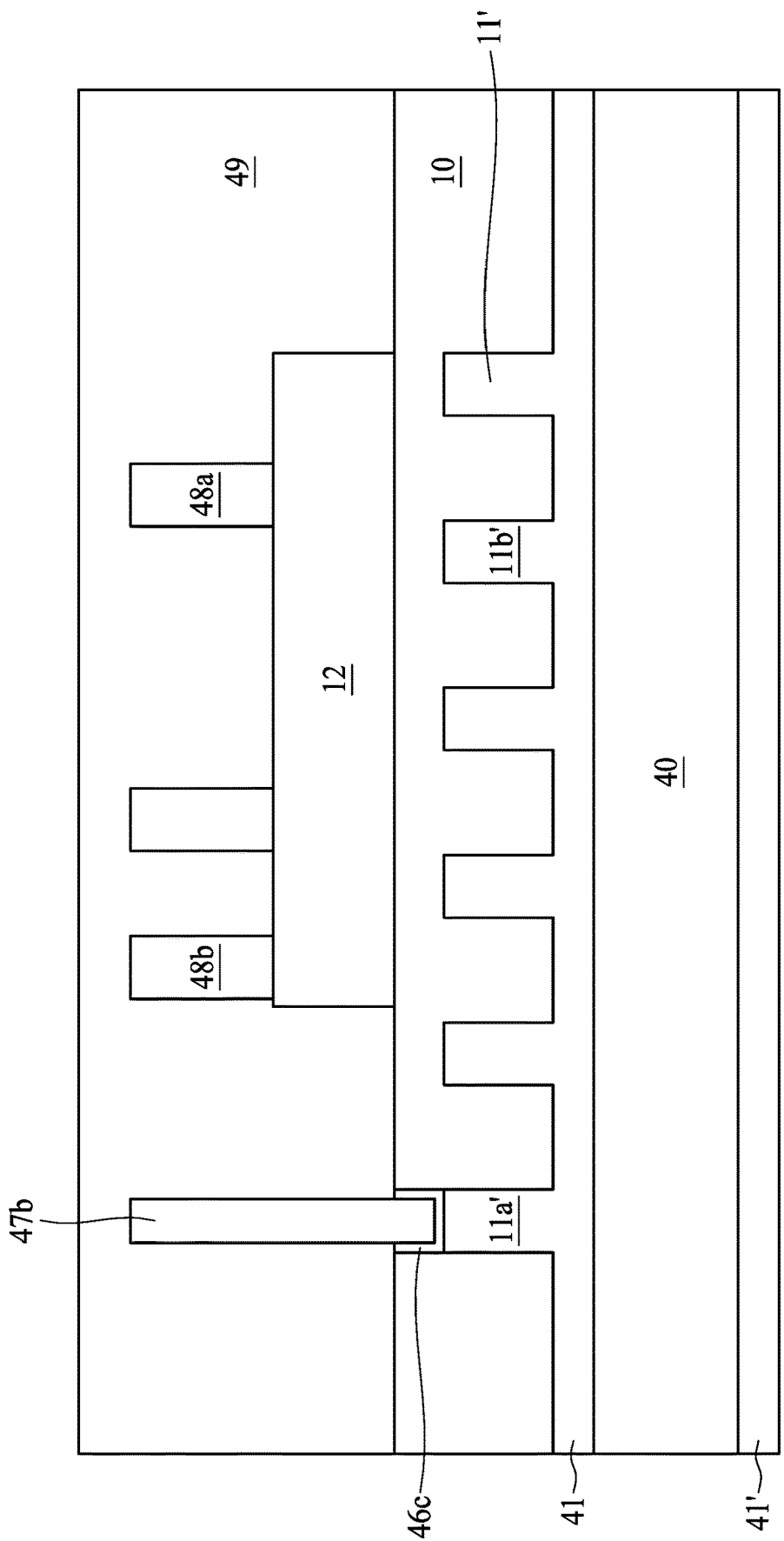

Referring to FIG. 4M, a semiconductor device 12 with a conductive terminal 48a and a conductive terminal 48b is attached to the dielectric layer 10 via an adhesive layer in, for example, a bonding process. Referring to FIG. 4N, an encapsulant 49 is formed on the dielectric layer 1n, for example, a molding process, to cover the conductive pillar 47b and the semiconductor device 12.

Figure 4O:
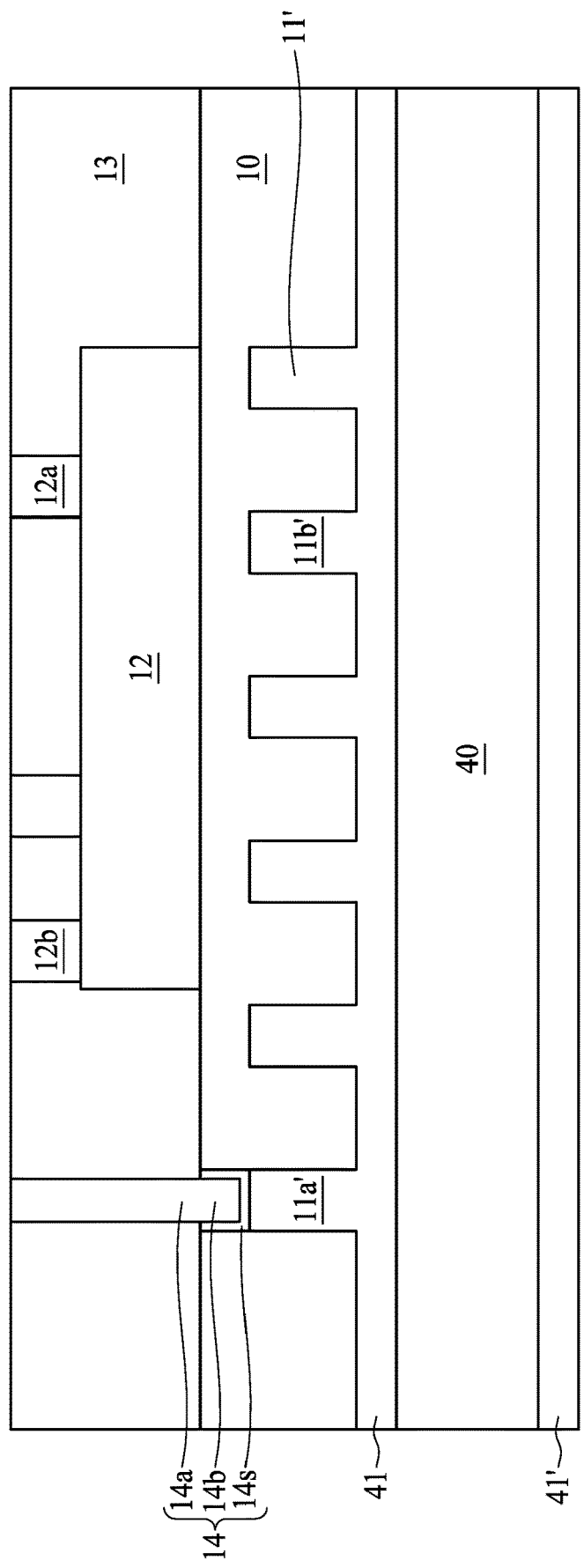

Referring to FIG. 4O, a conductive pillar 14 is formed by grinding the conductive pillar 47b. The conductive pillar 14 having a first portion 14a in the hole 43 to electrically connect to the exposed portion (e.g. the portion 11a') of the antenna structure 11' and a portion 14a protruding from the dielectric layer 10. An encapsulant 13 is formed by grinding the encapsulant 49. A conductive terminal 12a and a conductive terminal 12b are formed by grinding the conductive terminal 48a and the conductive terminal 48b. In some embodiments, the conductive pillar 14, the encapsulant 13, the conductive terminal 12a and the conductive terminal 12b may be formed in the same grinding process. The semiconductor device 12 remains intact in the grinding process.

The hole 43 has a space with a height of 43h, and the conductive pillar 47b is partially embedded in the hole 43, which prevents the conductive pillar 47b from being stripped in the etching process, the molding process or grinding process.

Figure 4P:
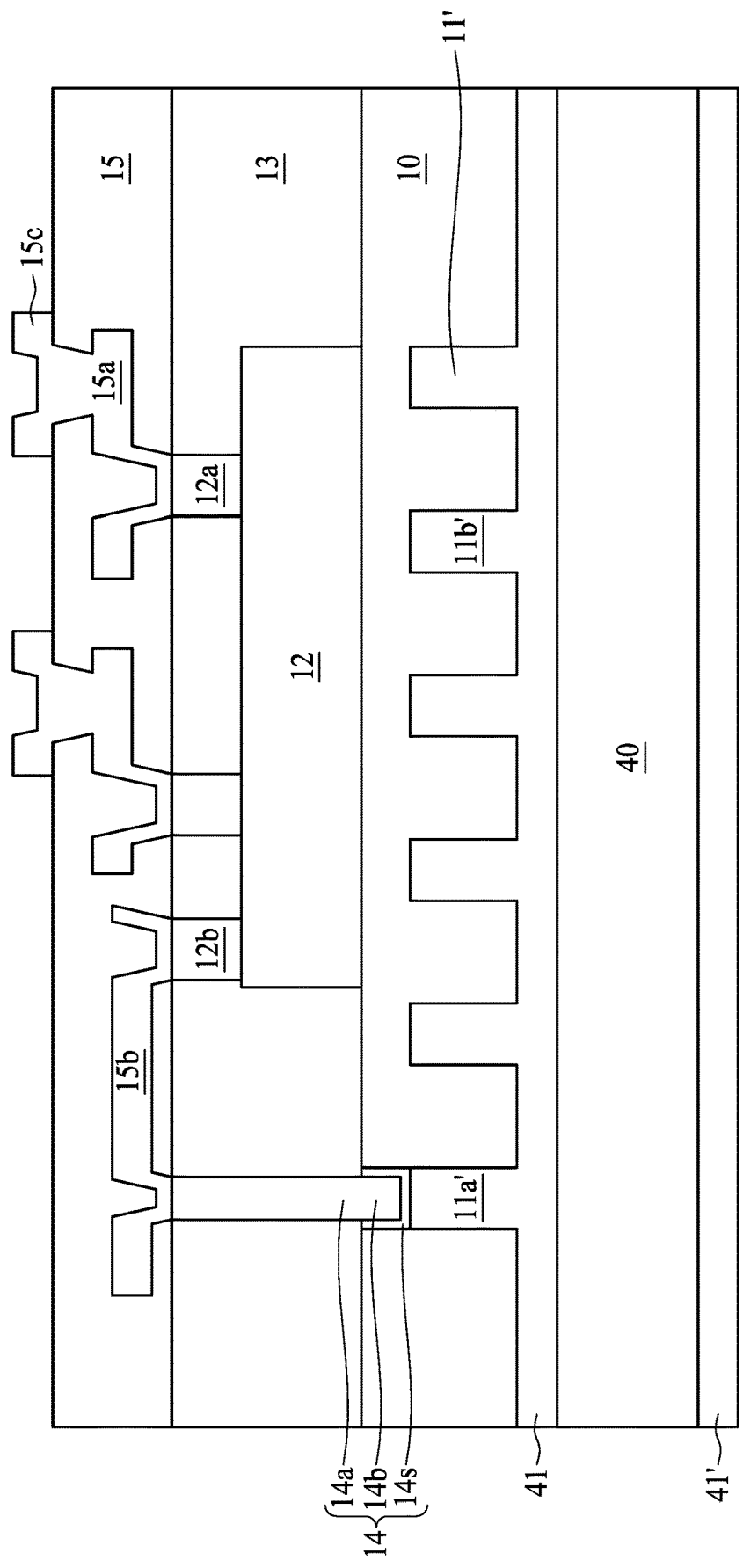
Figure 4Q:
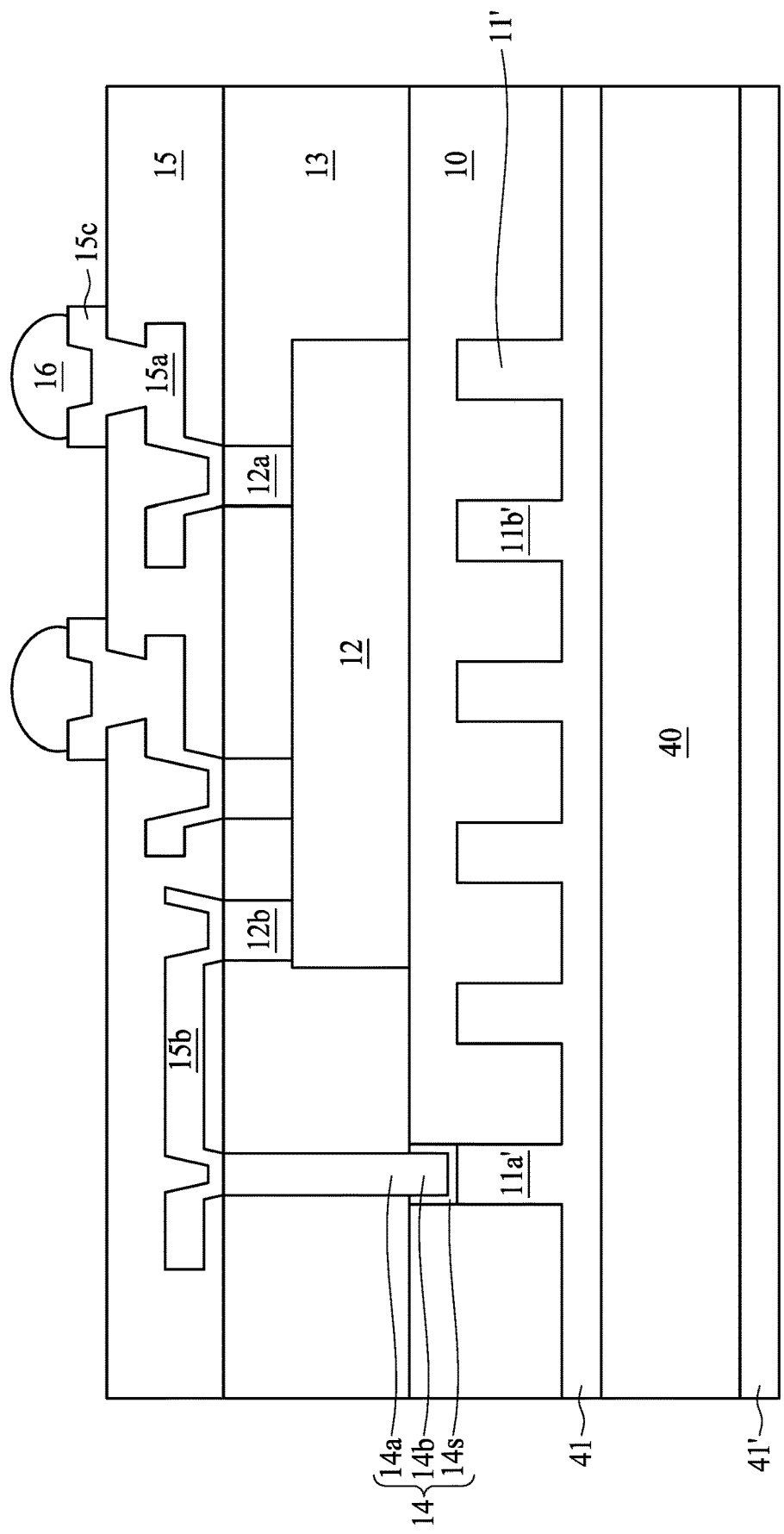

Referring to FIG. 4P, a RDL 15 is formed on the encapsulant 13 to electrically connect the conductive pillar 14 with the semiconductor device 12. The RDL 15 includes a redistribution structure (or an interconnection layer) 15a electrically connected with the conductive terminal 12a. The RDL 15 includes a redistribution structure 15b electrically connected with the conductive pillar 14 and the conductive terminal 12b. The RDL 15 includes a conductive pad 15c disposed on and electrically connected with the redistribution structure 15a. Referring to FIG. 4Q, an electrical contact 16 is formed on the conductive pad 15c.

Figure 4R:
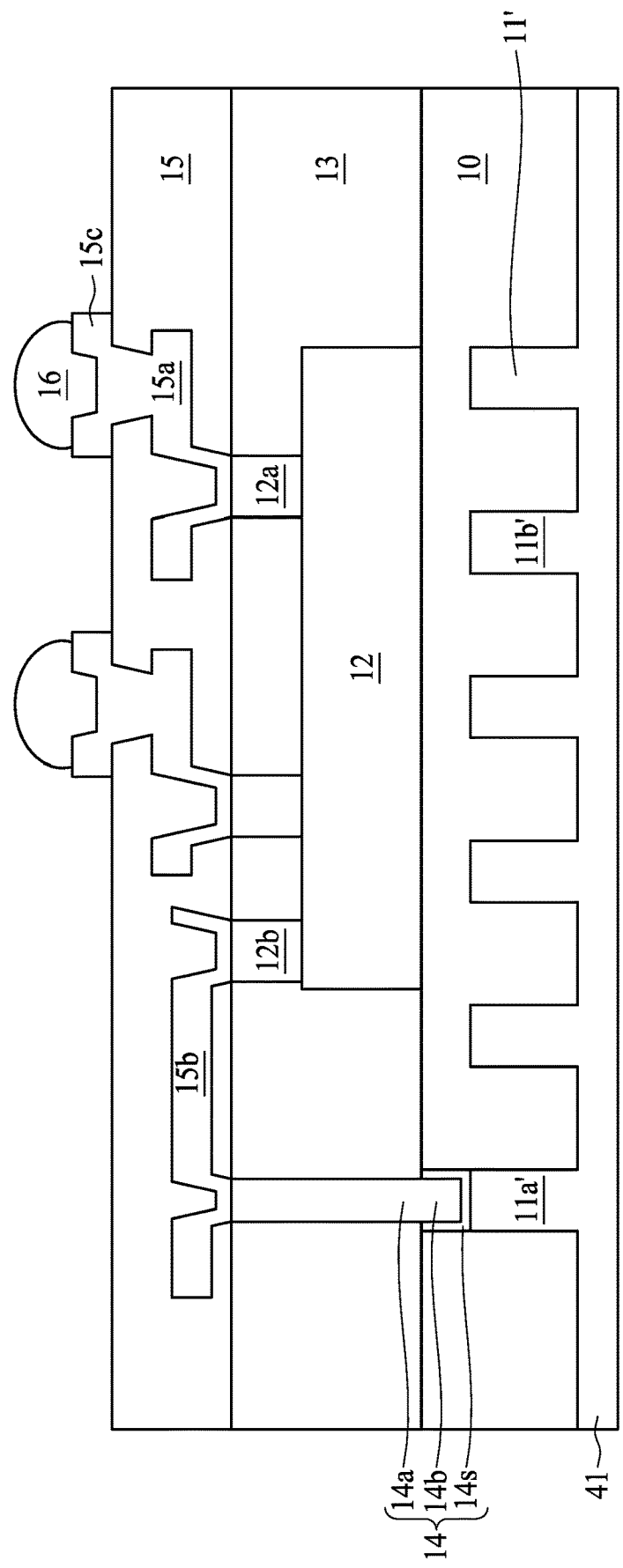
Figure 4S:
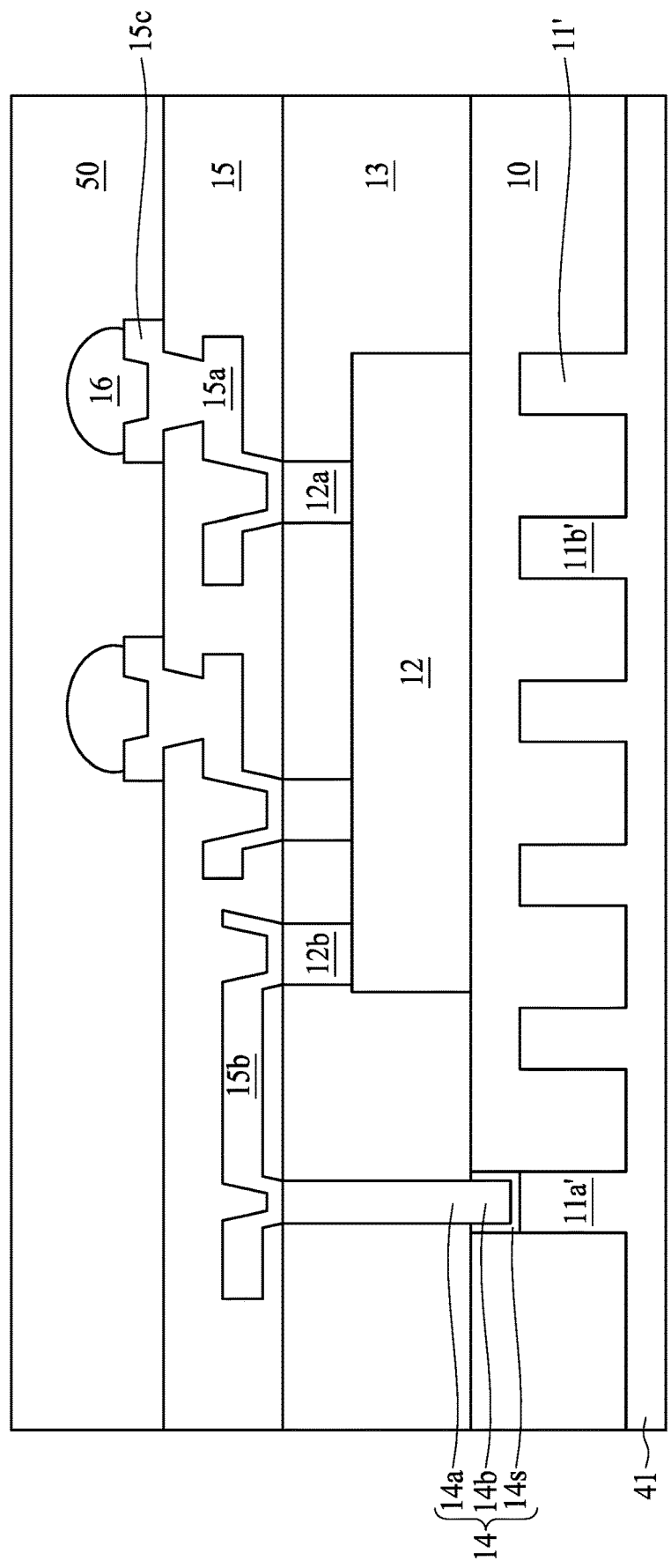
Figure 4T:
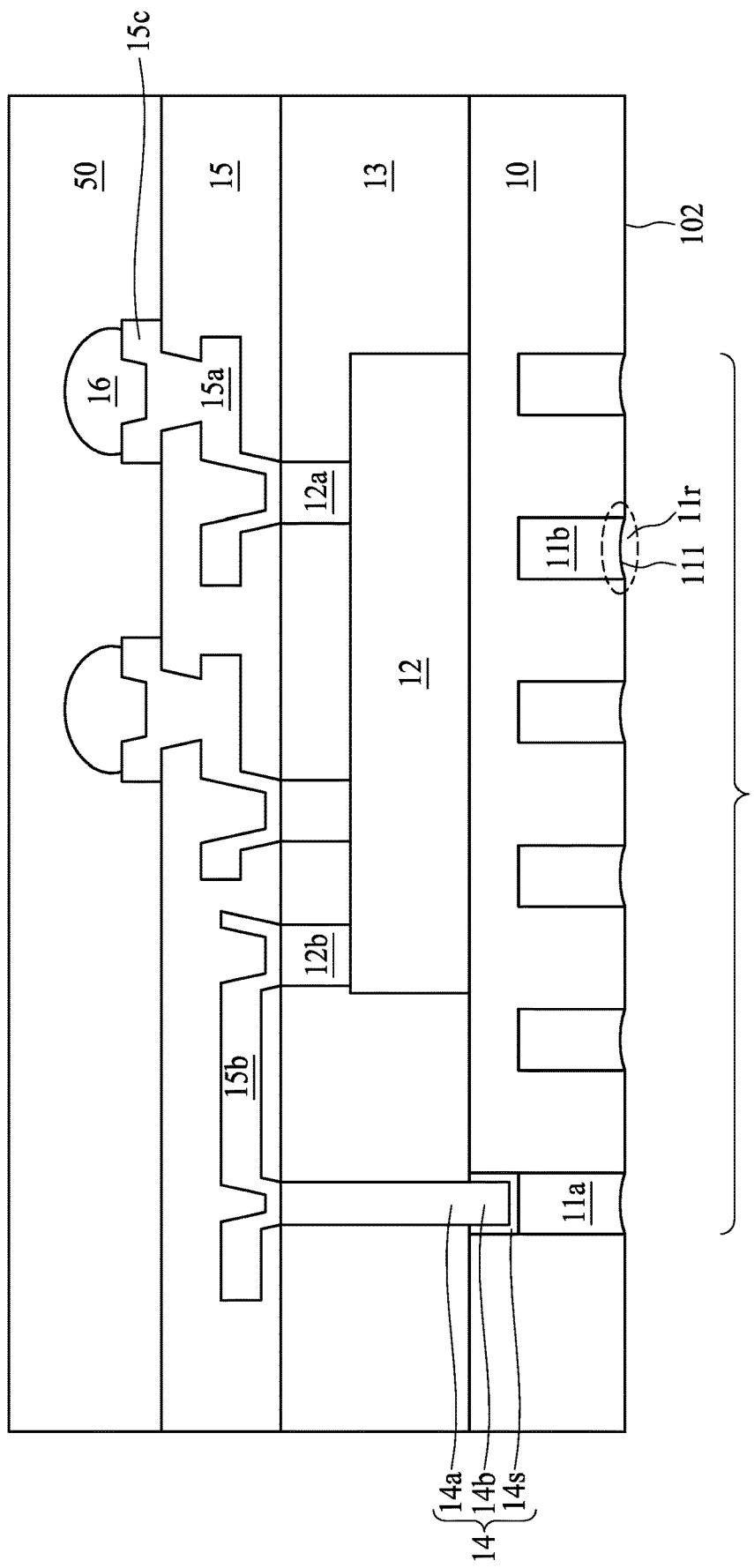

Referring to FIG. 4R, the substrate 40 and the conductive layer 41' are removed. Referring to FIG. 4S, a tap 50 is formed on the RDL 15 in, for example, a taping process. Referring to FIG. 4T, an antenna structure 11 is formed by removing the conductive layer 41 and grinding the antenna structure 11'. The antenna structure 11 is recessed from a surface 102 of the dielectric layer 10 (e.g. a recess 11r). The antenna structure 11 has a surface 111 exposed. Owing to the grinding process, the surface 111 may include a burr or stripe pattern. The antenna structure 11 is manufactured in a substrate-level process (e.g., a panel-substrate-level process). The panel-substrate-level process may have a greater area utilization rate than that of the wafer-level process. The panel substrate may have a dimension of 300*300 mm or 600*600 mm, which is greater than that of a wafer. Furthermore, integrating the antenna structure 11 into the dielectric layer 10 can save the cost of an extra temporary carrier commonly used in the semiconductor device package with an antenna. Therefore, the manufacturing efficiency of the antenna structure 11 is improved and simplified, which in turn reduces overall cost.

Furthermore, the tap 50 may be removed by, for example, a de-taping process and a singulation operation may be performed to form some semiconductor device packages 1a described and illustrated in FIG. 1A.

In some embodiments, the substrate 40 may be removed before the stage shown in FIG. 4F.

Figure 5:
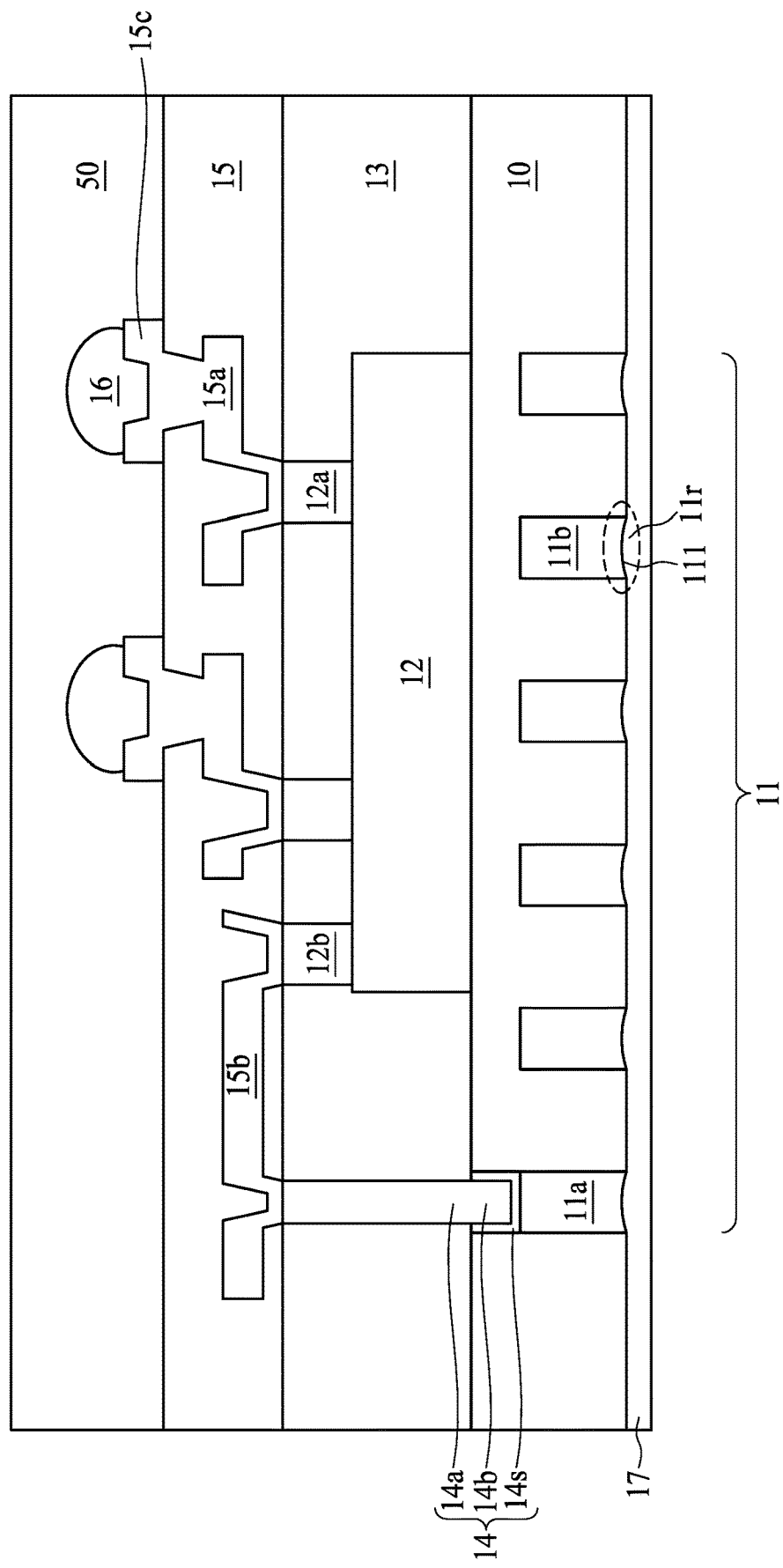
FIG. 5 illustrates one or more stages of a method for manufacturing a semiconductor device package in accordance with some embodiments of the subject application.

FIG. 5 illustrates one or more stages of a method for manufacturing a semiconductor device package in accordance with some embodiments of the subject application. The stage in FIG. 5 may follow several stages similar to the stages of FIG. 4A through FIG. 4T. Referring to FIG. 5, a protection layer 17 is formed on the antenna structure 11. Afterward, the tap 50 may be removed and a singulation operation may be performed to form some semiconductor device packages 1*b* described and illustrated in FIG. 1B.

FIG. 6A, FIG. 6B, FIG. 6C, FIG. 6D and FIG. 6E illustrate one or more stages of a method for manufacturing a semiconductor device package in accordance with some embodiments of the subject application.

Figure 6A:
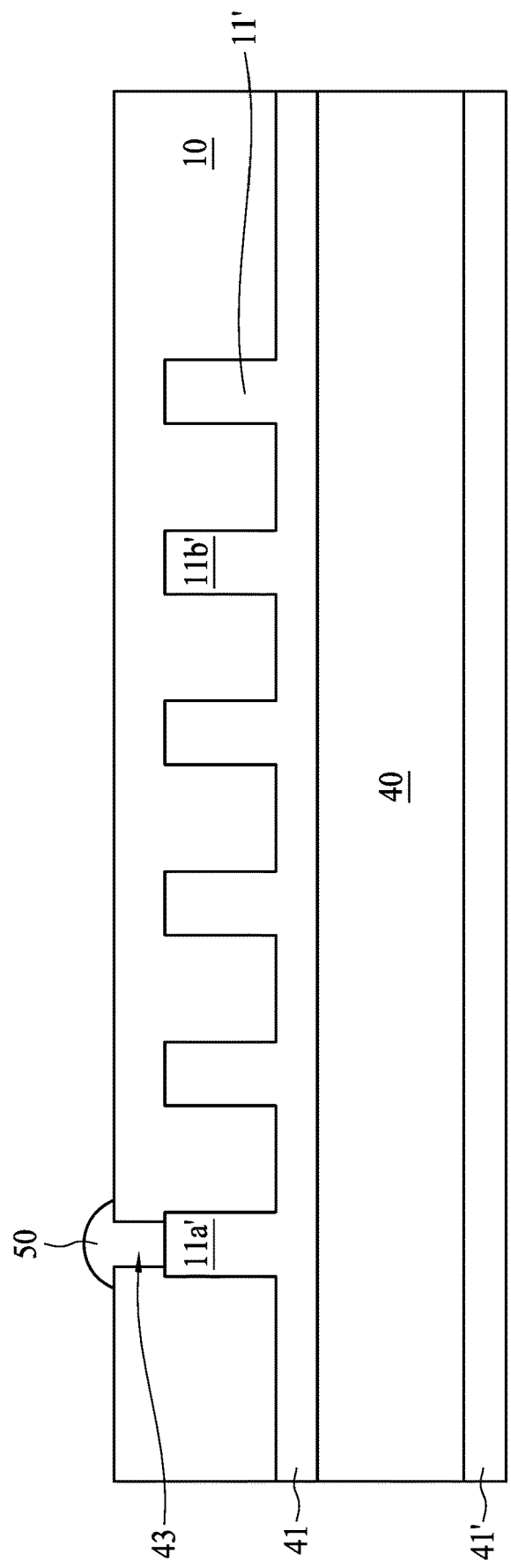
FIG. 6A, FIG. 6B, FIG. 6C, FIG. 6D and FIG. 6E illustrate one or more stages of a method for manufacturing a semiconductor device package in accordance with some embodiments of the subject application.
Figure 6B:
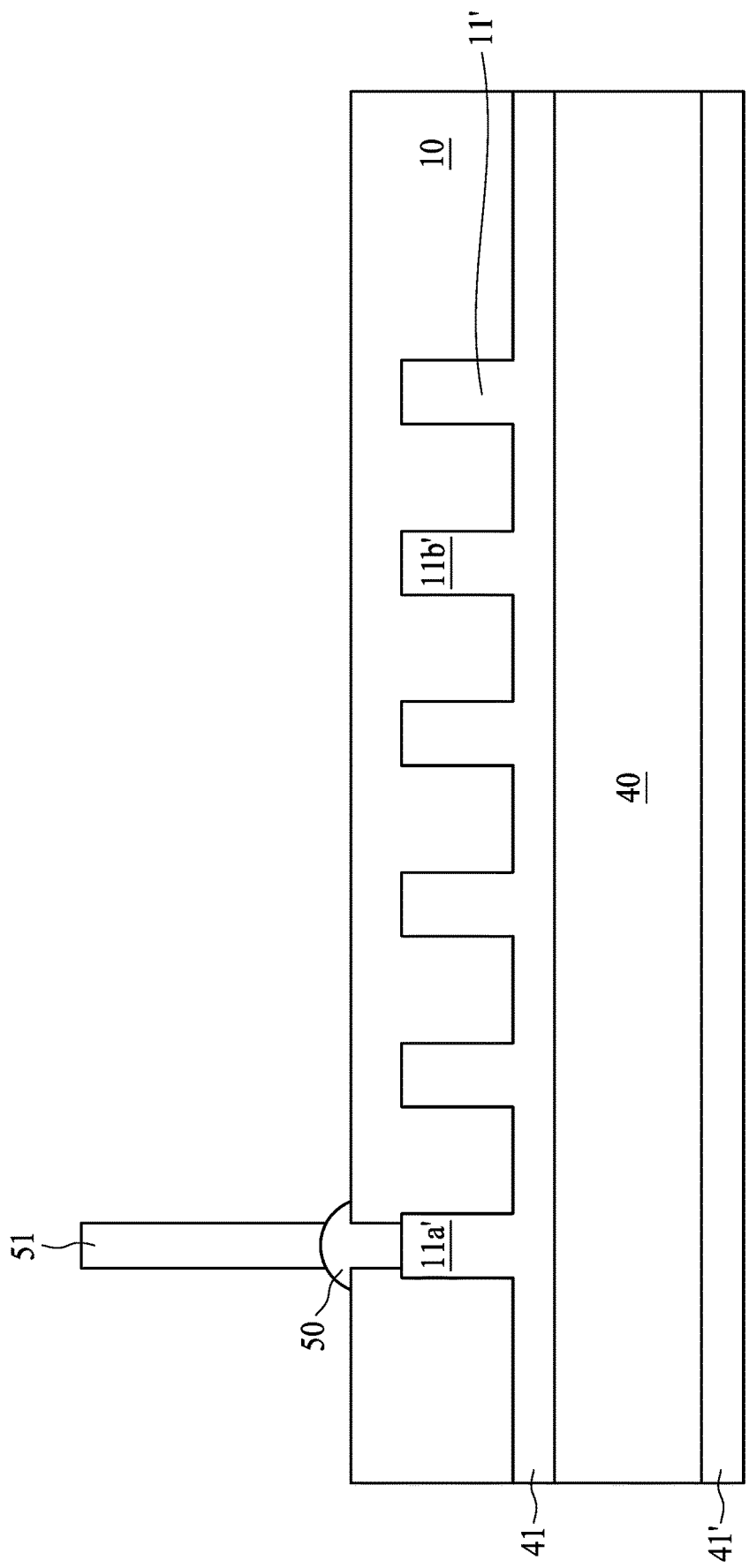

The stage in FIG. 6A may follow several stages similar to the stages of FIG. 4A through FIG. 4F. Referring to FIG. 6A, an electrical contact 50 (e.g. a solder ball) is formed in the hole 43. The electrical contact 50 includes a portion protruding from the dielectric layer 10. Referring to FIG. 6B, a conductive element 51 may be attached to the electrical contact 50. The conductive element 51 may include a conductive pillar.

Figure 6C:
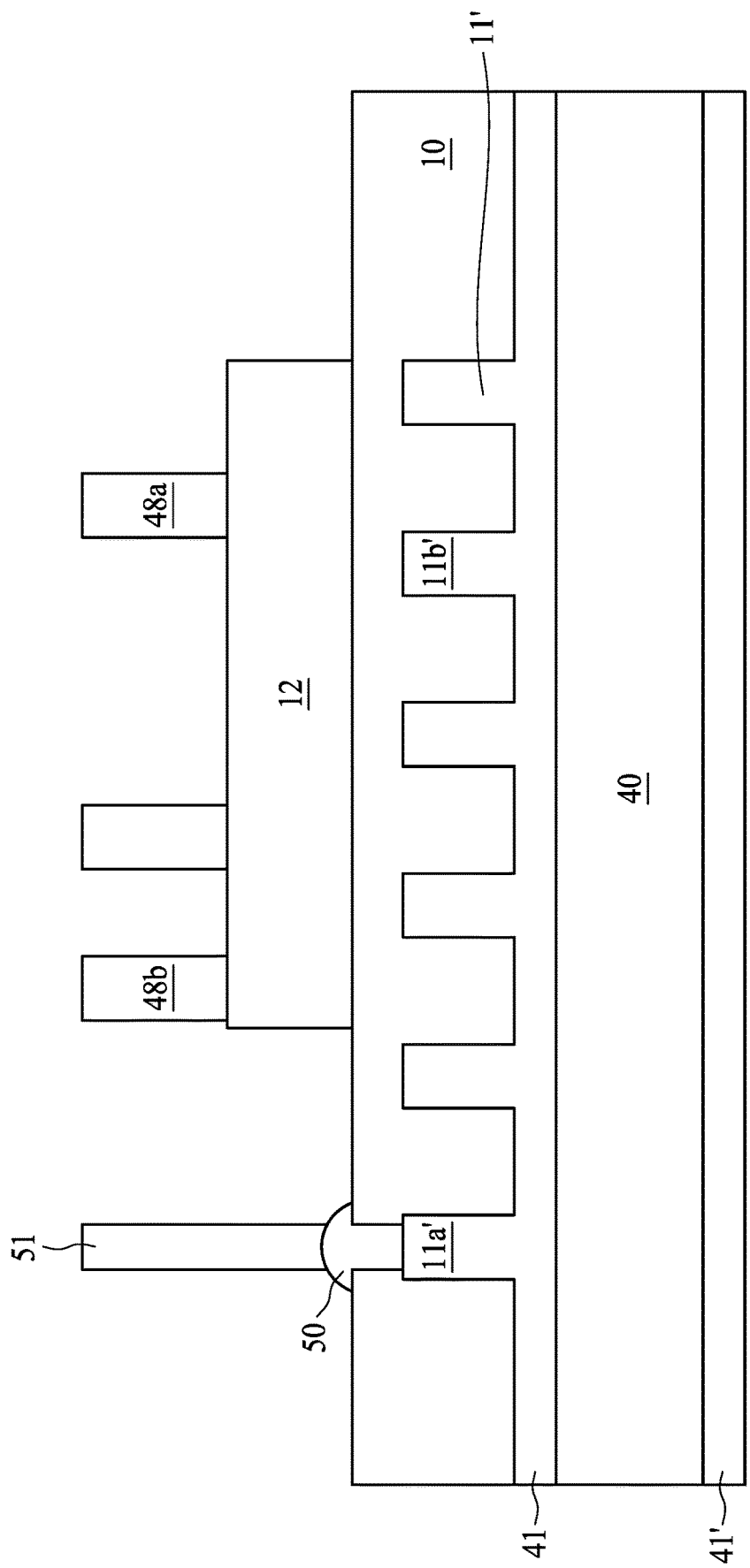
Figure 6D:
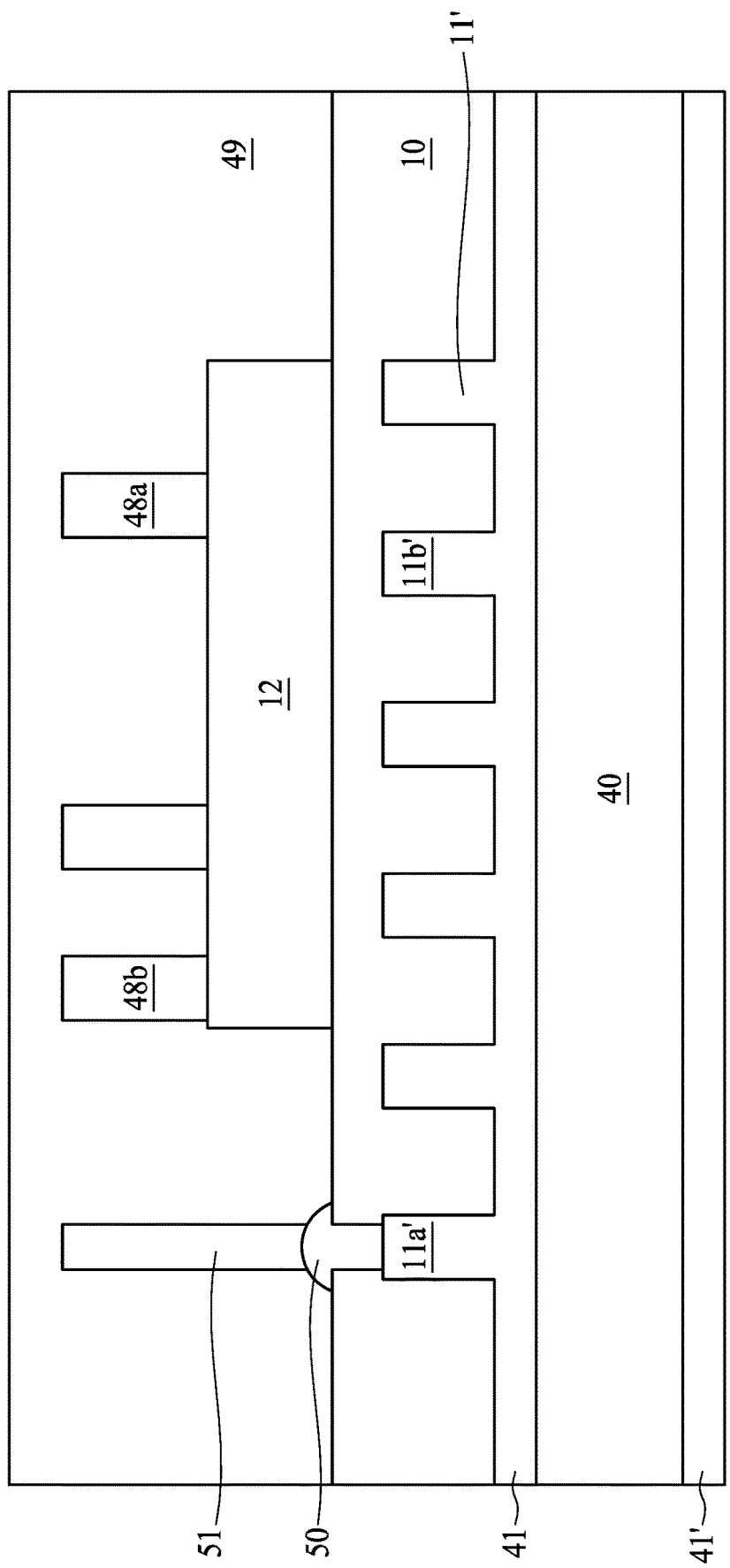

Referring to FIG. 6C, a semiconductor device 12 with a conductive terminal 48*a* and a conductive terminal 48*b* is attached to the dielectric layer 10 via an adhesive layer in, for example, a bonding process. Referring to FIG. 6D, an encapsulant 49 is formed on the dielectric layer in, for example, a molding process, to cover the conductive element 51, the electrical contact 50 and the semiconductor device 12.

Referring to 6E, a conductive structure 24 is formed by grinding the conductive element 51. The conductive structure 24 includes a conductive element 24*a* surrounded by the encapsulant. The conductive structure 24 includes an electrical contact 24*b* in direct contact with the portion 11*a*' of the antenna structure 11'. An encapsulant 13 is formed by grinding the encapsulant 49. A conductive terminal 12*a* and a conductive terminal 12*b* are formed by grinding the conductive terminal 48*a* and the conductive terminal 48*b*. In some embodiments, the conductive structure 24, the encapsulant 13, the conductive terminal 12*a* and the conductive terminal 12*b* may be formed in the same grinding process. The semiconductor device 12 remains intact in the grinding process.

Figure 6E:
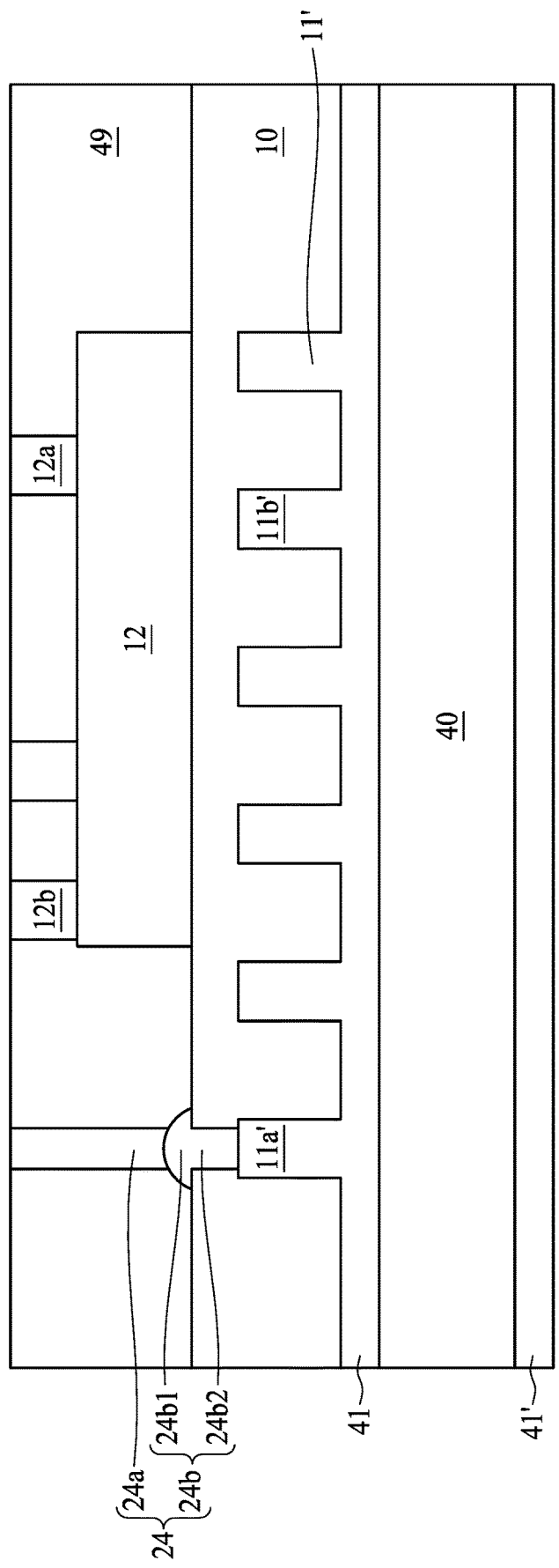

The stage in FIG. 6E may be followed by several stages similar to the stages of FIG. 4P through FIG. 4T. Afterward, the tap 50 may be removed and a singulation operation may be performed to form some semiconductor device packages 2*b* described and illustrated into FIG. 2B.

FIG. 7A, FIG. 7B, FIG. 7C, FIG. 7D, FIG. 7E, FIG. 7F and FIG. 7G illustrate one or more stages of a method for manufacturing a semiconductor device package in accordance with some embodiments of the subject application.

Figure 7A:
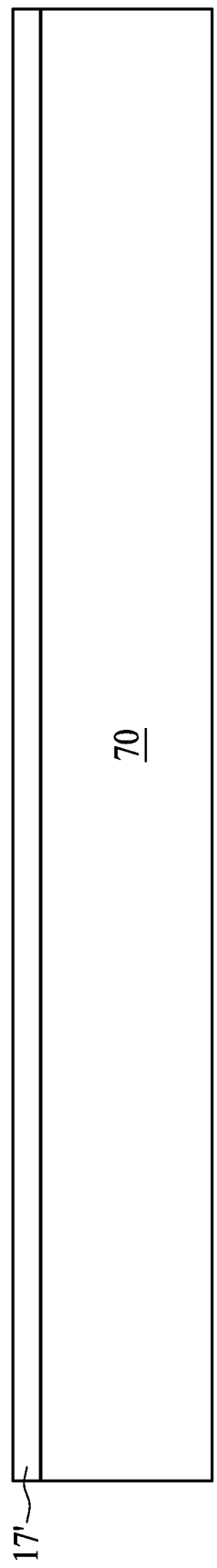
FIG. 7A, FIG. 7B, FIG. 7C, FIG. 7D, FIG. 7E, FIG. 7F and FIG. 7G illustrate one or more stages of a method for manufacturing a semiconductor device package in accordance with some embodiments of the subject application.
Figure 7B:
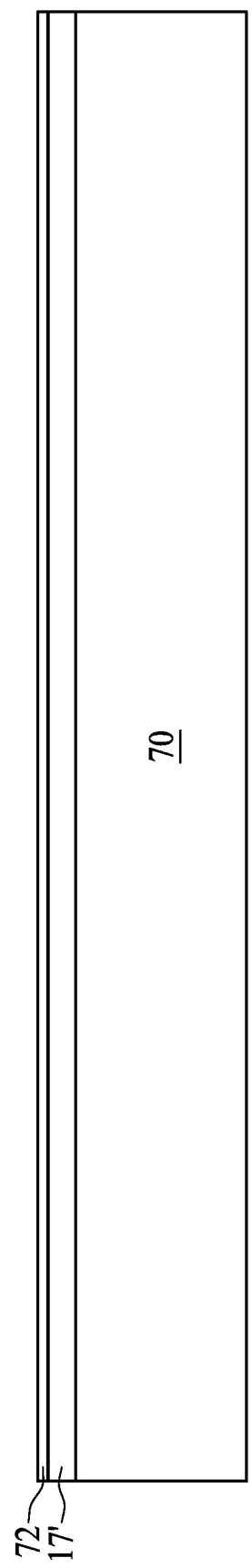

Referring to FIG. 7A, a substrate 70 is provided. A protection layer 17' is formed on the substrate 70 in, for example, a coating process. Referring to FIG. 7B, a seed layer 72 is formed on the protection layer 17' in, for example, a sputtering process.

Figure 7C:
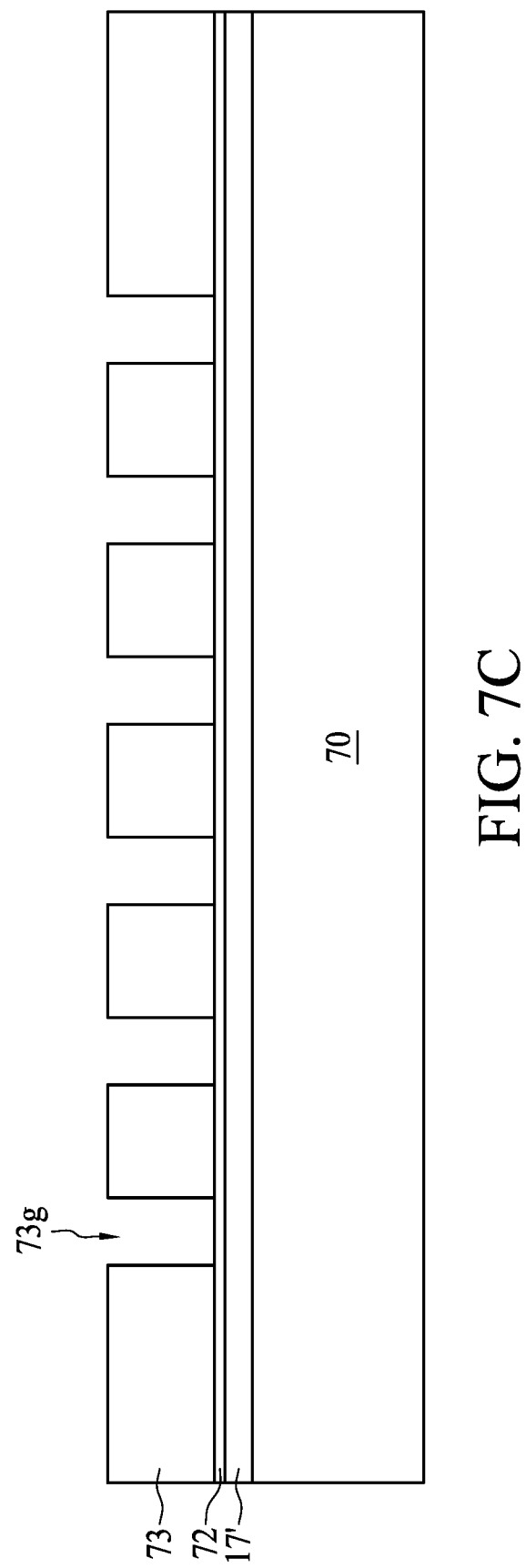
Figure 7D:
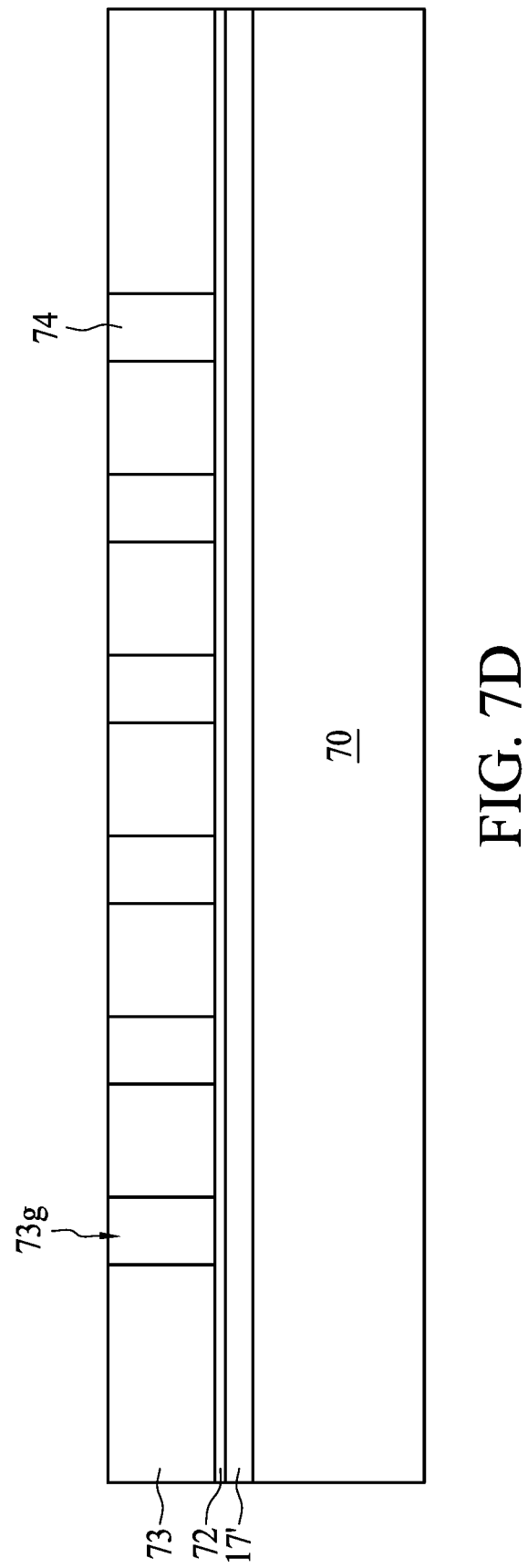
Figure 7E:
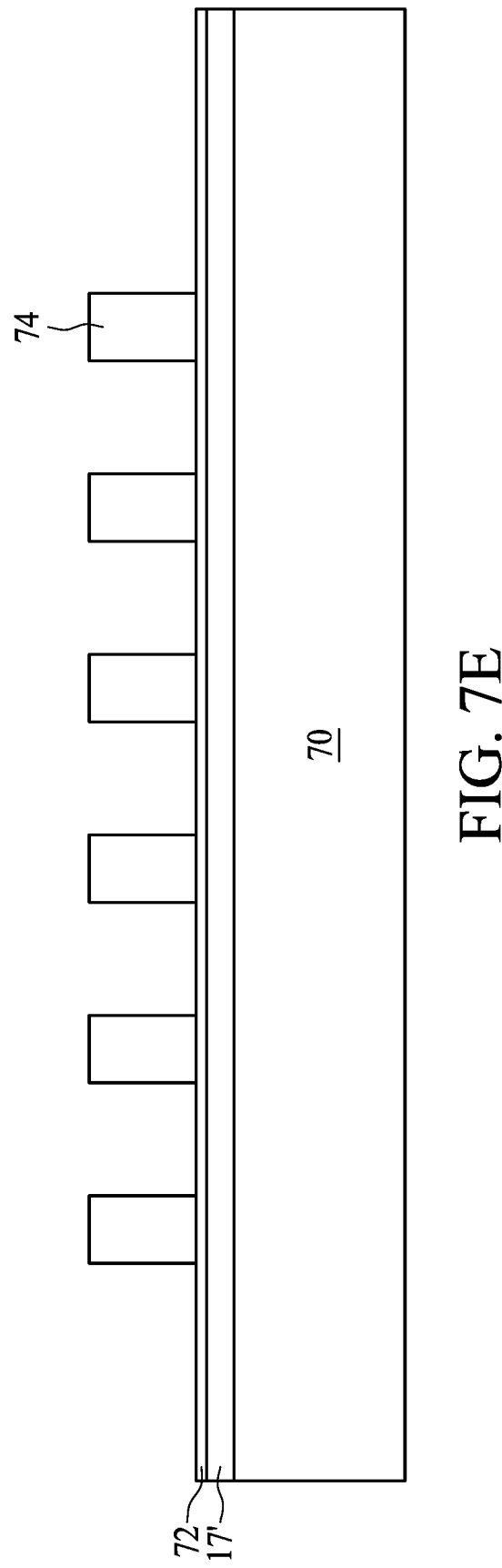

Referring to FIG. 7C, a photoresist layer 73 is formed on the seed layer 72 by, for example, a coating process followed by an exposure process. The photoresist 73 defines a gap 73*g* on the conductive layer 41. Referring to FIG. 7D, an antenna structure 74 is formed within the gap 73*g* in, for example, an electroplating process. The antenna structure 74 may have a height substantially the same as that of the photoresist layer 73. Referring to FIG. 7E, the photoresist layer 73 is removed by, for example, a plasma ashing process.

Figure 7F:
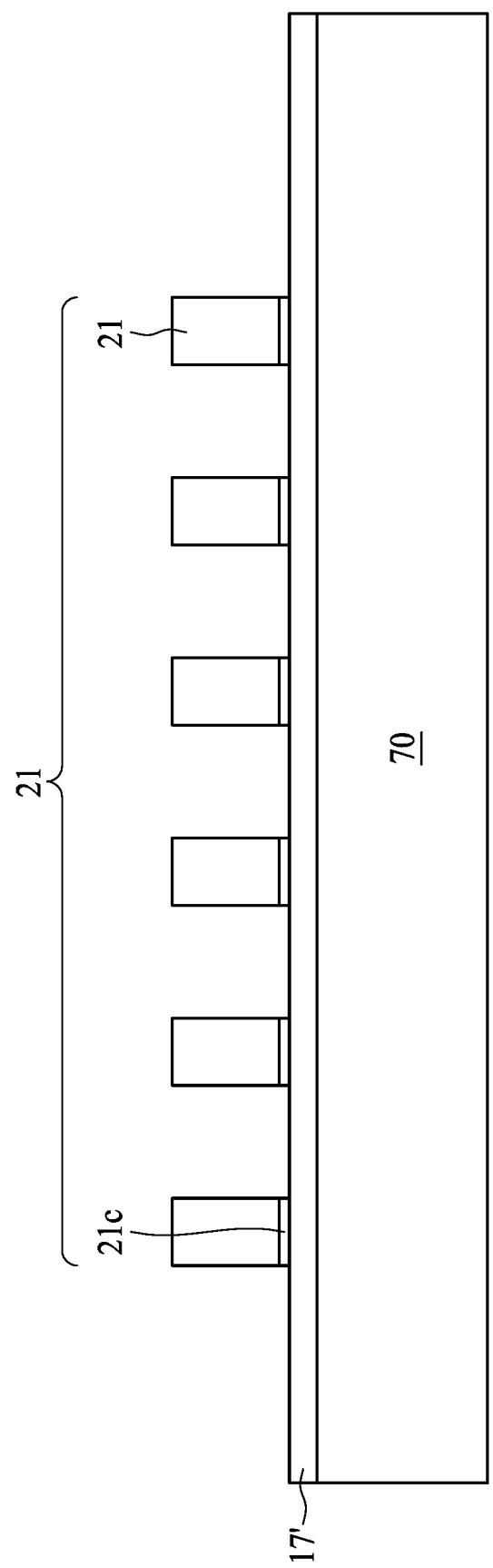

Referring to FIG. 7F, an antenna structure 21 is formed by removing a portion of the seed layer 72 exposed from the antenna structure 74. The antenna structure 21 includes a seed layer in direct contact with the protection layer 72. Referring to 7G, a dielectric layer 10 is formed on the antenna structure 21 and the protection layer 72 in, for example, a coating process followed by a grinding process. The dielectric layer 10 surrounds the antenna structure 21.

Figure 7G:
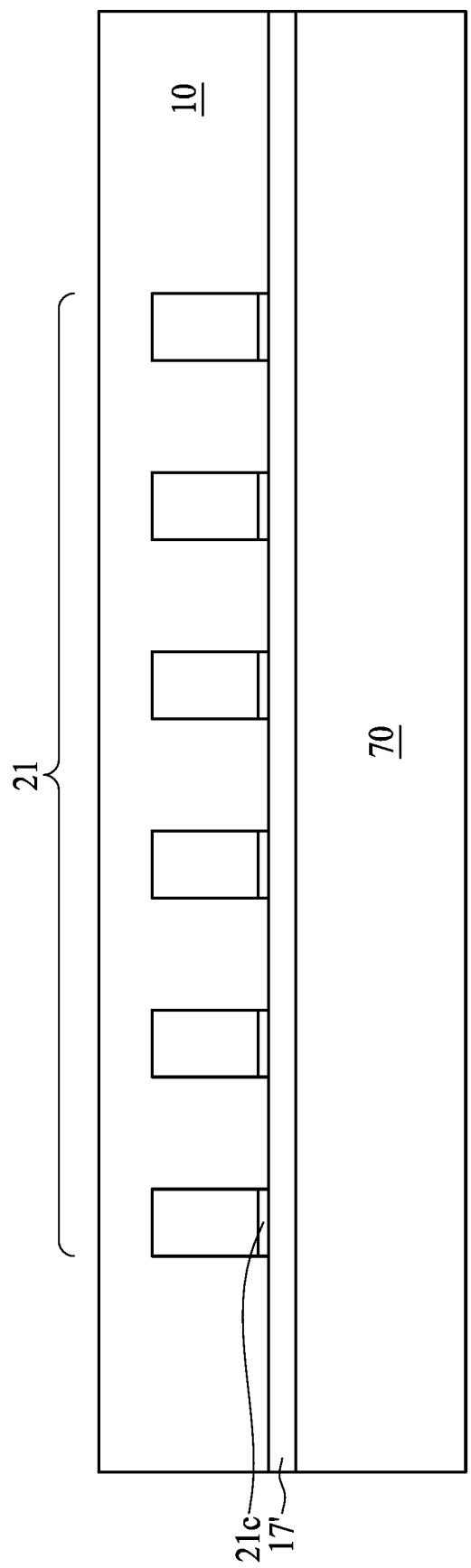
Figure 8:
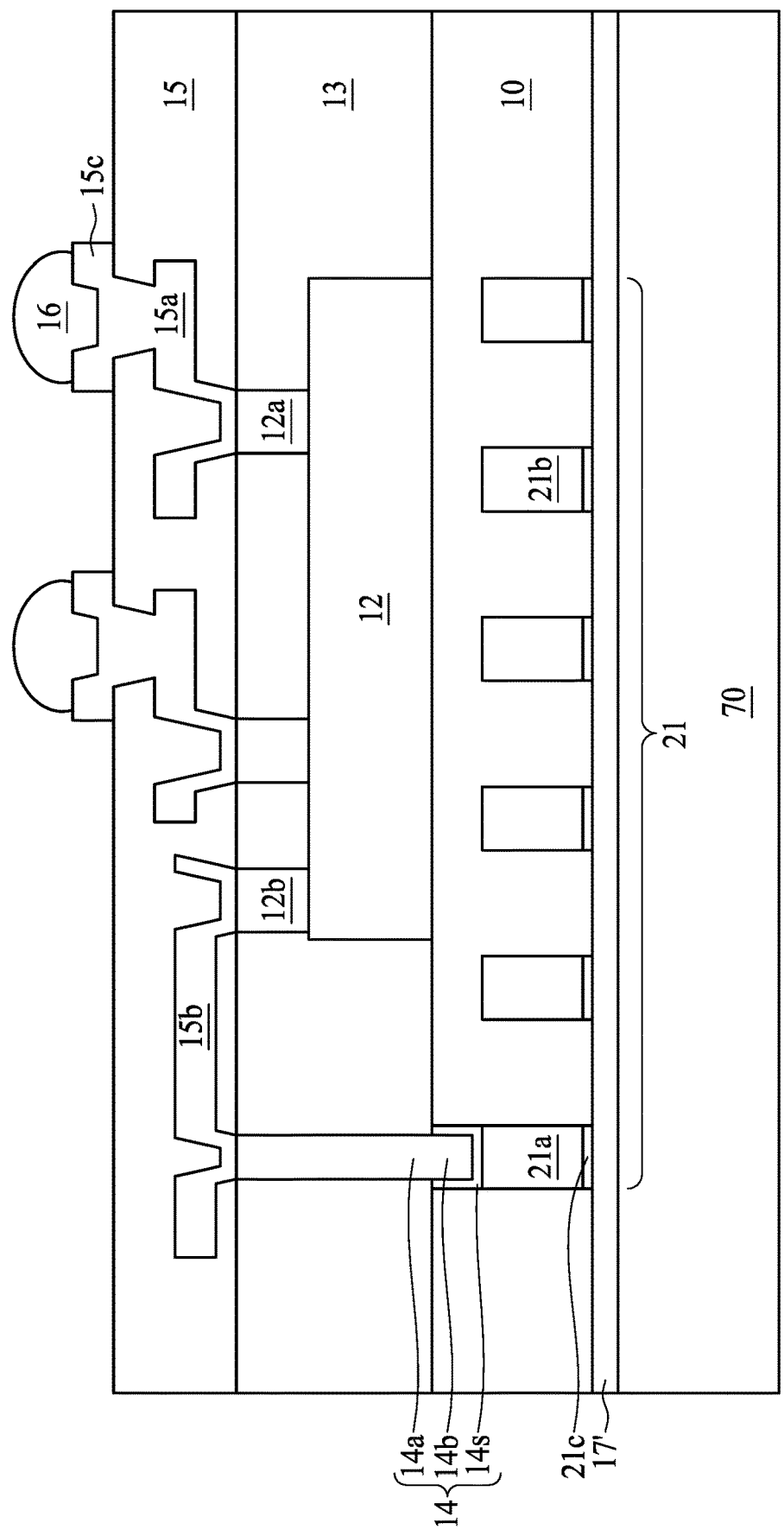
FIG. 8 illustrates one or more stages of a method for manufacturing a semiconductor device package in accordance with some embodiments of the subject application.

The stages of FIG. 7G may be followed by several stages similar to the stages of FIG. 4F through FIG. 4Q to form a package structure of FIG. 8.

FIG. 8 illustrates one or more stages of a method for manufacturing a semiconductor device package in accordance with some embodiments of the subject application. Referring to FIG. 8, a protection layer 17' may be exposed by removing the substrate 70 and a singulation operation may be performed to form some semiconductor device packages 2*a* described and illustrated in to FIG. 2A. Since a grinding process as that depicted in FIG. 4T is omitted, the antenna structure 21 may have a surface without a burr or stripe pattern.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a dielectric layer;
   an antenna structure disposed in the dielectric layer;
   a semiconductor device disposed on the dielectric layer,
      wherein the semiconductor device has a first surface and a second surface, wherein the second surface in contact with the dielectric layer and the first surface is opposite to the second surface, and the semiconductor device has a plurality of sides extending between the first surface and the second surface of the semiconductor device;

an encapsulant surrounding and continuously, directly contacting the plurality of sides and the first surface of the semiconductor device; and a conductive pillar having a first portion and a second portion, wherein the first portion is surrounded by the encapsulant and the second portion is embedded in the dielectric layer.

2. The semiconductor device package of claim 1, wherein the first portion has a first lateral surface and the second portion has a second lateral surface, and the first lateral surface and the second lateral surface are substantially coplanar and in contact with each other.

3. The semiconductor device package of claim 1, wherein the antenna structure comprises an antenna element substantially aligned with the conductive pillar, and a width of the antenna element is greater than a width of the conductive pillar and is less than a second width of the conductive pillar.

4. The semiconductor device package of claim 1, further comprising a protective layer disposed on the antenna structure and a plurality of antenna elements each having a recess, wherein a portion of the protective layer is disposed within the recesses of the antenna elements of the antenna structure.

5. The semiconductor device package of claim 1, wherein the first portion and the second portion of the conductive pillar are in contact with each other, and wherein the first portion and the second portion each has an aspect ratio exceeding 1.

6. The semiconductor device package of claim 5, further comprising a redistribution layer (RDL) disposed on the encapsulant, wherein the RDL electrically connects the conductive pillar with the semiconductor device, wherein the antenna structure comprises a plurality of antenna elements each having a recess, and wherein the semiconductor device is disposed between the recesses of the antenna elements and the RDL.

7. The semiconductor device package of claim 6, wherein the encapsulant is in contact with the dielectric layer.

8. The semiconductor device package of claim 7, wherein the first portion and the second portion of the conductive pillar have a substantially uniform width.

9. The semiconductor device package of claim 8, wherein the conductive pillar has a monolithic structure extending through an interface between the dielectric layer and the encapsulant.

10. The semiconductor device package of claim 9, further comprising a seed layer surrounding the second portion of the conductive pillar, wherein the seed layer is in contact with the antenna structure.

* * * * *